(12) United States Patent
Wood

(10) Patent No.: US 7,805,697 B2
(45) Date of Patent: Sep. 28, 2010

(54) ROTARY CLOCK SYNCHRONOUS FABRIC

(75) Inventor: John Wood, Santa Cruz, CA (US)

(73) Assignee: Multigig Inc., San Jose, CA (US)

( * ) Notice: Subject to any disclaimer, the term of this patent is extended or adjusted under 35 U.S.C. 154(b) by 184 days.

(21) Appl. No.: 11/110,966

(22) Filed: Apr. 19, 2005

(65) Prior Publication Data

US 2005/0251775 A1   Nov. 10, 2005

Related U.S. Application Data

(63) Continuation-in-part of application No. 10/497,730, filed as application No. PCT/GB02/05514 on Dec. 6, 2002, now Pat. No. 7,203,914.

(30) Foreign Application Priority Data

Apr. 19, 2004   (GB) ................. 0408726.8

(51) Int. Cl.
    *G06F 17/50* (2006.01)
(52) U.S. Cl. .............. 716/13; 716/1; 716/6; 716/7; 716/10
(58) Field of Classification Search .......... 716/1, 716/6, 7, 10, 13
    See application file for complete search history.

(56) References Cited

U.S. PATENT DOCUMENTS

| | | | |
|---|---|---|---|
| 5,640,112 A | 6/1997 | Goto et al. | |
| 5,652,549 A | 7/1997 | Unterricker | |
| 5,978,571 A * | 11/1999 | Grundmann | 703/23 |
| 6,460,165 B1 | 10/2002 | Ismail et al. | |
| 6,584,597 B1 * | 6/2003 | Kishinevsky et al. | 716/1 |
| 6,925,622 B2 | 8/2005 | Reyes | |
| 7,158,925 B2 * | 1/2007 | Rich et al. | 703/17 |

(Continued)

FOREIGN PATENT DOCUMENTS

CN         1143860         2/1997

(Continued)

OTHER PUBLICATIONS

Wood, John, Nov. 2001, "Rotary Traveling-Wave Oscillator Arrays: A New Clock Technology," *IEEE Journal of Solid State Circuits*, 36:11.

(Continued)

*Primary Examiner*—Vuthe Siek
(74) *Attorney, Agent, or Firm*—IPxLaw Group LLP

(57) ABSTRACT

Methods for generating a design for logic circuitry using rotary traveling wave oscillators (RTWOs) are described. A plurality of RTWOs are is arranged into an array of rows and columns. Adjacent elements in the array are interconnected so that the clocks in adjacent element are phase synchronous. Clocked devices are placed along the signal path of each array element and each is connected to one of the multiple phases provided by the RTWO element. The logic circuitry, described by a netlist, is divided into a number of partitions and each of these partitions is mapped to one of the array elements. The logic circuitry of the partition is then placed within or about the element of the array to which the partition is mapped and the circuitry in the partition is connected between the clocked devices in the element of the array, according to the net list.

6 Claims, 13 Drawing Sheets

U.S. PATENT DOCUMENTS

| | | | |
|---|---|---|---|
| 7,203,914 B2* | 4/2007 | Wood | 716/4 |
| 2003/0131329 A1 | 7/2003 | Gonzalez | |

FOREIGN PATENT DOCUMENTS

| | | |
|---|---|---|
| GB | 1247199 | 9/1971 |
| GB | 00/00175 | 1/2000 |
| GB | 2 349 524 A | 1/2000 |
| GB | 01/01067 | 3/2001 |
| GB | 01/02069 | 5/2001 |
| WO | WO9512263 | 5/1995 |
| WO | WO 2004/025706 A2 | 3/2004 |

OTHER PUBLICATIONS

Sutherland et al.,1999, "Logical Effort: Designing Fast CMOS Circuits (The Morgan Kaufmann Series in Computer Architecture and Design)," *Morgan Kaufmann*; 1st Edition paperback.

MultiGiG Ltd., 2000, 2001, "Rotary Explorer v0.5 User's Guide," pp. 1-33.

Deutsch et al., Sep. 1995, "Modeling and characterization of long on-chip interconnections for high-performance microprocessors," *IBM J. Res. Develop.*, 39(5):547-567.

Hendrickson B., Leland R., The Chaco User's Guide, Sandia National Laboratories, Version 2.0, Jul. 1995.

Hendrickson B, Leland R., & Van Driessche, R., Enhancing Data Locality by Using Terminal Propagation, 29th Hawaii Intl. Conf. System Sciences, IEEE, 1996.

Kundarewich, P, & Rose J., Synthetic Circuit Generation Using Clustering and Iteration, IEEE Transactions on Computer Aided Design of Integrated Circuits and Systems, vol. 23, No. 6, Jun. 2004 (Available as Master's Thesis, 2002).

International Search Report; ref: PCT/GB02/05514, Jan. 29, 2004.

* cited by examiner

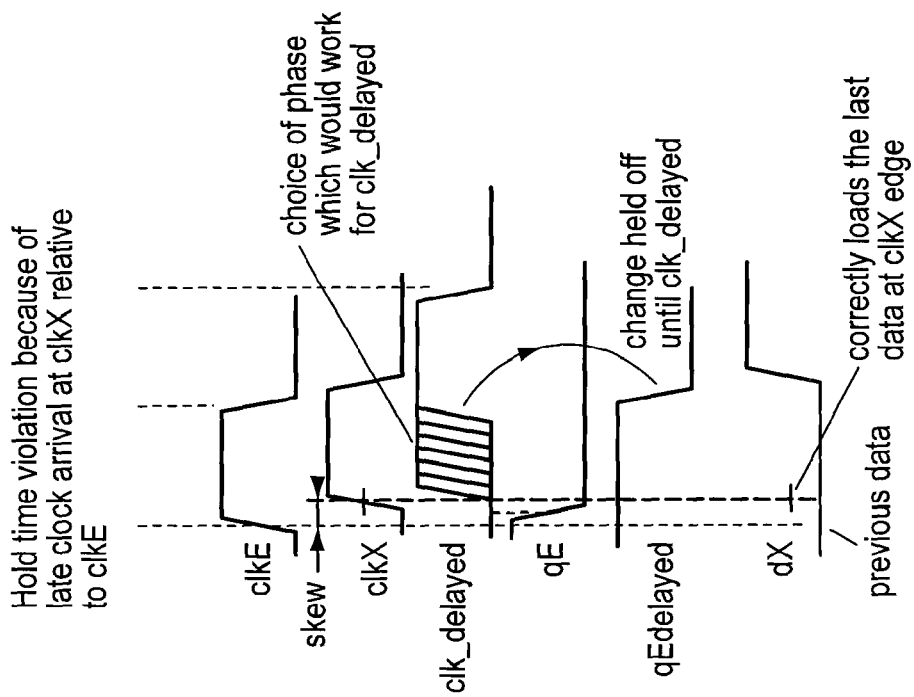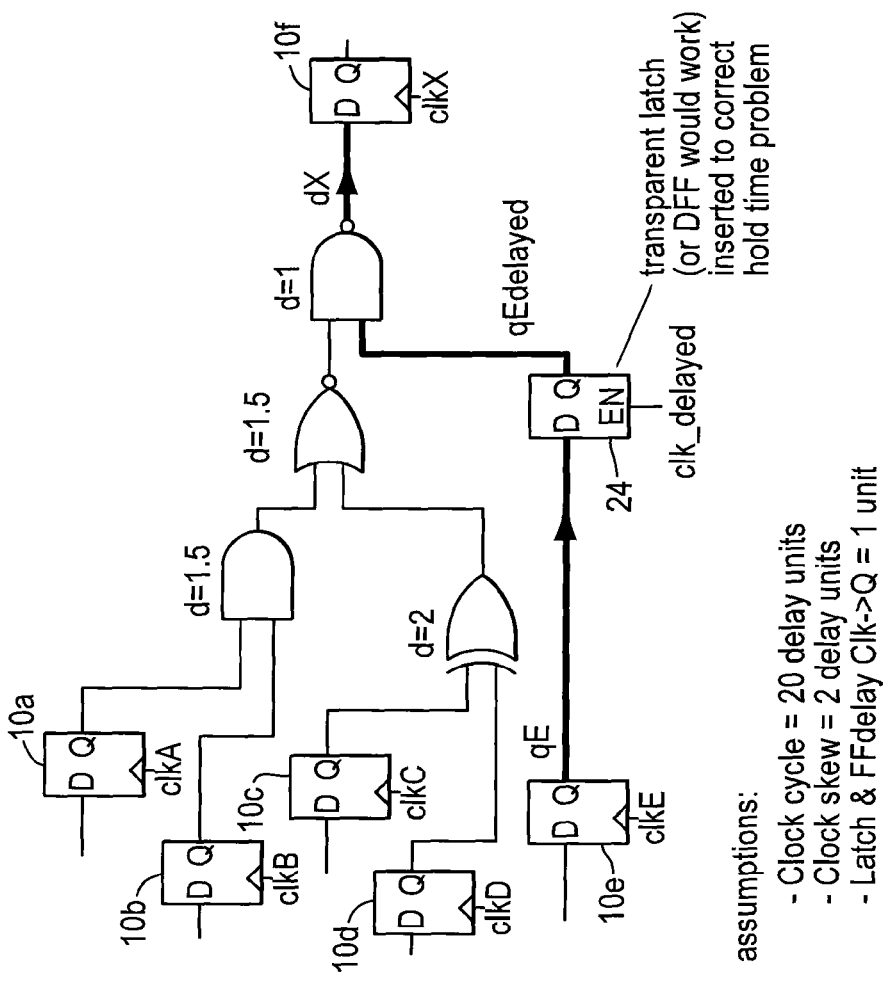
FIG. 2

FIG. 3    Perpendicular clock bars for FF's within regions
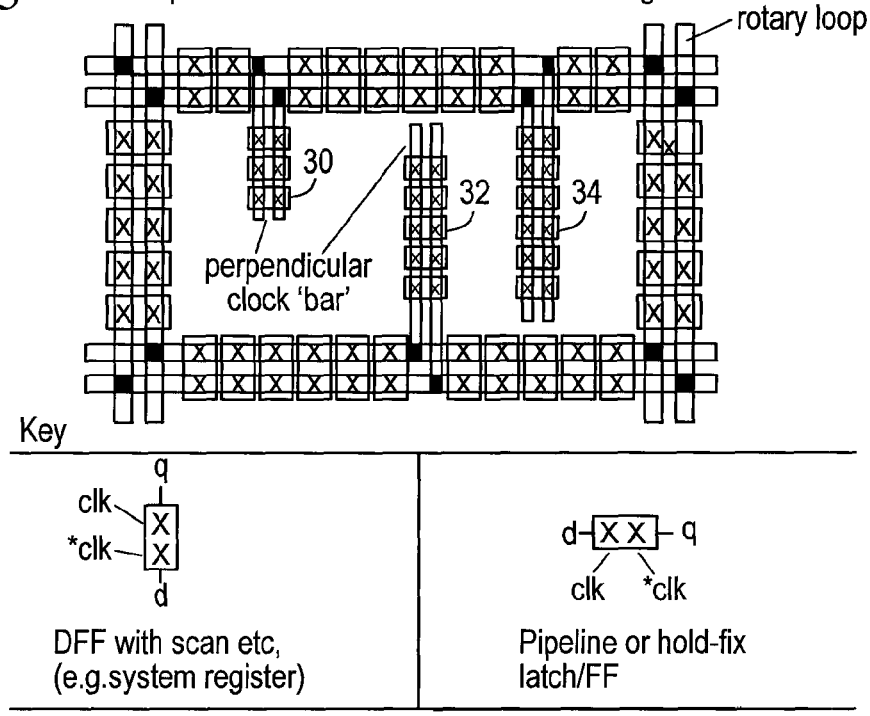
Key
DFF with scan etc,
(e.g. system register)
Pipeline or hold-fix
latch/FF
Notes:
   not all connections not shown on all flipflops
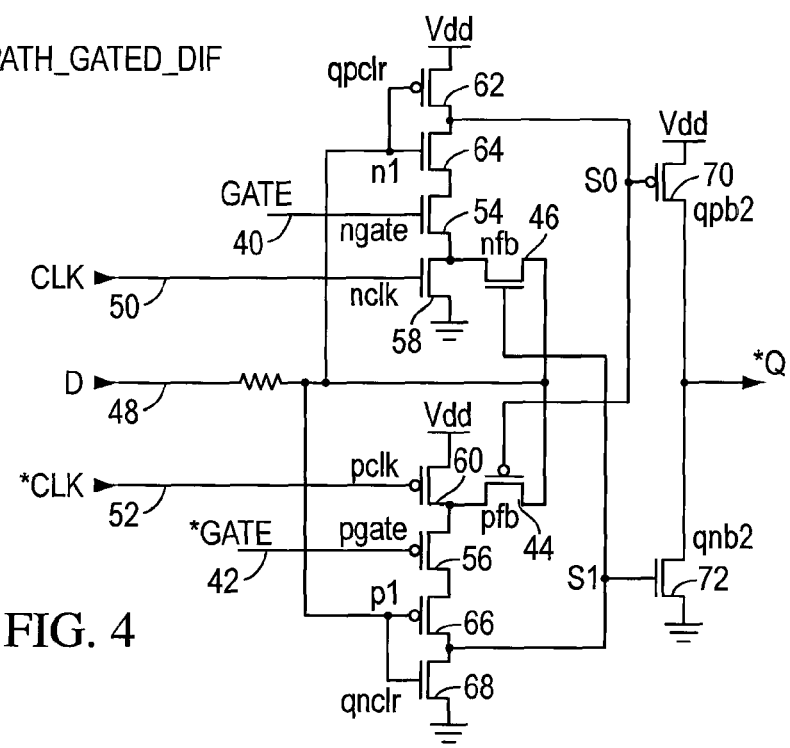
FIG. 4

Method of using 2-rotary grids as the partitioning unit to limit the amount of clock 'phase' on the boundaries note that vertical paths through the partition units are same-phase in and out - suits datapaths in the vertical direction "hidden" phase from interfaces Two stages like below on opposite phases As above The routine is one method of implementing the Rotary Clock which uses the best features and provides an automated way of choosing a optimal layout. It also works well within the given constraints of the Rotary Clock

ROTARY CLOCK SYNCHRONOUS FABRIC

CROSS-REFERENCE TO RELATED APPLICATIONS

This application is a continuation-in-part of U.S. Application, U.S. Application, titled "Timing Circuit CAD", Ser. No. 10/497,730, now U.S. Pat. No. 7,203,914, published as US2005/0010883, which application is a national stage application for international application PCT/GB02/05514, filed Dec. 6, 2002.

This application is related to and incorporates by reference the following applications:

GB0203605.1, titled "Hierarchical Clocking System", filed in Great Britain on Feb. 15, 2002, now included in U.S. application titled "Electronic Circuits", Ser. No. 10/504,559;

GB0212869.2, titled "Rotary Clock Design Flow", filed in Great Britain on Jun. 6, 2002, now included in U.S. application, titled "Electronic Circuits", Ser. No. 10/504,559;

GB0129352.1, titled "Timing Etc Circuitry", filed in Great Britain on Dec. 7, 2001, now included in U.S. application, titled "Timing Circuit CAD", Ser. No. 10/497,730; and PCT/GB03/00719, titled "Electronic Circuits", filed Feb. 14, 2003, now U.S. application Ser. No. 10/504,559.

This application claims priority to and incorporates by reference Great Britain Application GB0408726.8, titled "PNR2004" filed Apr. 19, 2004.

FIELD OF THE INVENTION

The present invention relates generally to the design and layout of circuitry for an integrated circuit and, more particularly, to the design and layout of said circuitry with rotary traveling wave oscillators.

DESCRIPTION OF THE RELATED ART

Hierarchical design is an abstraction to make the designer's job easier. Even before the advent of HDL (Hardware Description Language, such as Verilog), designers would prefer to create a desired functionality by assembling pre-designed, pre-characterized sub-modules or black-boxes, instead of trying to design a whole chip at the individual transistor level.

VLSI chip today are generally specified by HDL code created by a designer. HDL code constructs are available to fully support the notion of Modules and Cells as hierarchical items. Module instances are coded explicitly in the HDL, while Cells are instantiated when the corresponding low-level HDL is passed through "Logic Synthesis" to automatically create the sub-module's functionality by assembling a set of pre-defined cells.

At the bottom of this Logical hierarchy are pre-defined transistor-level circuits (Cells), while the top of the hierarchy is the whole chip with its I/O pins. At intermediate levels of the hierarchy are what are known variously as Modules, blocks, sub-chips, lower-level blocks, or hierarchical blocks, which themselves are made up of smaller modules, cells, and wiring.

As far as the final chip layout is concerned, a hierarchy is not present. All of the hierarchical levels are expanded to a set of "Flat" (no hierarchy) masks patterns prior to manufacture. Every transistor and wire must be present together on the mask.

After logic synthesis, a Place-and-Route (P&R) CAD tool is used to position the Cells and the Modules on the floorplan of the chip and route the required interconnects between the modules and cells. At this point placement can be "Hierarchical" or "Flat." A Hierarchical placement system steps through each module type of a design (using the information from the logical hierarchy of the design) to ensure that all cells belonging to a given module are placed-and-routed in their own allocated for the module; components from different modules are not intermingled. Flat placement is different. First, the hierarchy is expanded resulting in the loss of information that associates the parent module for a particular cell or sub-module. Cells from many hierarchical levels end up together and are equivalent (in terms of placement) in the netlist to be placed-and-routed.

This has two consequences. First, Placement and Routing algorithms can do a better job flat versus the hierarchical placement. Compared to Logical Hierarchy, placement of a flattened netlist allows for optimizations between-modules and intermingling of cells when this results in better wire length of delay. Second, tool run-times become much slower. Run time is much worse than linear with problem size. Flat placement runs can take days to complete and performing static timing analysis can also be very time consuming.

The term Physical hierarchy has evolved to supplement and contrast with the term "Logical Hierarchy" (which was previously known as simply 'hierarchy.' Usually, Physical Hierarchy is just a term for Physically-based design-partitioning.

The logical hierarchy of a design is determined when by a human HDL designer is tasked to break-down a large design problem into a number of smaller sub-designs. The result appears in the HDL code as Module definitions and instances. Recently, with DSM effects (Deep Submicron Effects, interconnects and placements (physical effects)) dominating the design challenge, the partitioning and clustering implicit in the Logical Hierarchy chosen by a designer, who is likely unfamiliar with these effects, is unlikely to be optimal. Therefore, a market has formed for CAD tools that attempt to extract a so-called Physical Hierarchy from the HDL designer's Logical Hierarchy. These tools work by taking the Verilog code containing the Logical Hierarchy and examining it for "placeability" and "routability" based on a simplified P&R (place and route) algorithm that considers DSM effects. New partition points and hierarchical groupings are considered by the tool and an optimization proceeds until a new, equivalent set of fairly independent HDL codes is generated that are more optimized for placement. Logical->Physical HDL conversion tools emit many separate HDL files, each of which can be synthesized, placed, routed and timed independently of all the others (lessening the tool overhead and allowing in-parallel backend design by multiple engineers). Such a process has the advantage of the Hierarchical P&R method but captures some of the advantages of the 'flat' approach since the new physically-based HDL partition points have re-defined the boundaries and group membership of the modules to give a more optimal P&R similar to the flat method.

Whereas HDL-level physical hierarchy extraction is the earliest point in the design cycle at which to perform these partitions (and makes the 'in-parallel' design effort with less tool overhead possible early on), physical hierarchy creation can be deferred to later in the design.

For many years, P&R tools have to been optimizing placement and routing with a kind-of 'Physical Hierarchy' (although it was never called this). P&R tools now often flatten a design and then immediately re-cluster the circuit into new physically based groupings based on Min-Cut, wirelength, and other heuristics and move cells between partionions, iteratively, to improve the cuts. Timberwolf is an old P&R code, which, in version 6, uses a clustering algorithm. All of these are examples of Physical Hierarchy creation for a "divide and conquer" approach to solving large problems and overcoming sub-optimal initial logical-hierarchical.

A logic synthesis tool converts HDL descriptions of human-generated Verilog source code into a collection of cells (from a pre-defined library) and a wiring definition (netlist), which would implement the intended function when created on a VLSI chip. Conversion from high-level source code into low-level netlists increases designer productivity but prevents performance-boosting 'handcrafted' optimizations that are possible in a non-automated custom flow. Custom circuit designers have increased awareness, understanding and experience of the circuits and how they must be laid-out optimally on chip. The first automated logic synthesis tools did not factor physical effects such as interconnect capacitance, wire length, crosstalk into the logic synthesis process and did the mapping of logic-function to cells based solely on area or speed of the cells themselves, producing poor results.

Eventually as more physical effects were considered for the mapping of cells (effects modeled by improved wireload models, wire length estimators and feedback from 'first-cut' placement tools), the term 'Physical Synthesis' was used to described the new, more optimal tools. No longer was there a clear-cut divide between front-end and back-end designs when interconnect effects start to dominate and the tools became interlinked.

One of the hallmark features of a Physical Synthesis tool is the ability to do "Cell Sizing," i.e., the choosing from a variety of Sizes' of cell depending on the required interconnect load. [Ref David Haris/Ivan Sutherland book 'Logical Effort'].

The physical synthesis tool chooses a small, weak-output-drive versions of a cell (e.g., Min-sized NAND gate) for low-fanout nets, whereas a large NAND gate from the library is chosen where the physical synthesis tool predicts a long interconnect length on the fanout and/or a large number of loads to drive.

A Snake Router is a router that can find closed-loop rotary layouts of non-rectangular shape. Instead of working on a fixed grid, a set of possible paths is determined by an obstruction growth algorithm. A 'seed' route is found by random walk (and it must be closed), and then iterative heuristic methods consider improvements to the basic shape, and including avoidance of 'do not route' areas that may be off-grid. This facilitates placement of Rotary clock around existing fixed floor planning objects, such as SRAM, I/O pins, Flip-chip bumps etc. There are two options. In one, the initial stage is similar to the standard Rotary Grid placement. A grid of given X,Y spacing is specified and stored onto the layout. In the other, a Snake router is employed where grid is inappropriate, such as where there are too many obstructions for a grid to be established or the circuit to be clocked is too small to contain a single ring of the required length (length increases with decreasing frequency).

BRIEF SUMMARY OF THE INVENTION

A method in accordance with an embodiment of the present invention is a method for generating a design for logic circuitry. The method includes (i) arranging a plurality of rotary traveling wave oscillators (RTWO) into a number of rows and a number of columns to form a rotary oscillator array, where each RTWO has a signal path that provides a clock with multiple phases, (ii) interconnecting adjacent array elements so that the RTWO in each array element is phase synchronous with the RTWO in an adjacent element, (iii) placing a number of clocked devices along the signal path of each array element, each clocked device having a clock input, a data input and a data output, (iv) connecting each clock input of the plurality of clocked devices in each element to one of the multiple phases provided by the RTWO, (v) partitioning the logic circuitry into a number of partitions and mapping each partition to one or more RWTO array elements, such that the number of interconnects between partitions, according to a netlist, is minimized and such that partition boundaries are at the data outputs of clocked devices, (vi) placing the logic circuitry partitions into regions corresponding to areas bounded by the one or more RTWO elements of the array to which the partition is mapped, and, (vii) connecting the circuitry in the partition between the clocked devices in the element of the array according to the net list by determining the worst-case logic delays of the partitioned circuitry, and selecting the clocked devices between which the partition circuitry is connected based on the worst-case logic delays.

The operation of connecting the circuitry in the partition may include determining the worst-case logic delays of the partitioned circuitry and then selecting the clocked devices between which the partitioned circuitry is connected based on the worst-case logic delays, thereby using clock skew scheduling to determine the connections.

BRIEF DESCRIPTION OF THE DRAWINGS

These and other features, aspects and advantages of the present invention will become better understood with regard to the following description, appended claims, and accompanying drawings where:

FIG. 2 shows a new option of inserting level-sensitive latches (or DFFs) to slow down fast paths and fix hold time problems;

FIG. 3 illustrates routing of rotary clock tap stubs available in the perpendicular direction;

FIG. 4 is an alternative low-clock-capacitance direct-drive DFF;

DETAILED DESCRIPTION OF THE INVENTION

Figure 1:
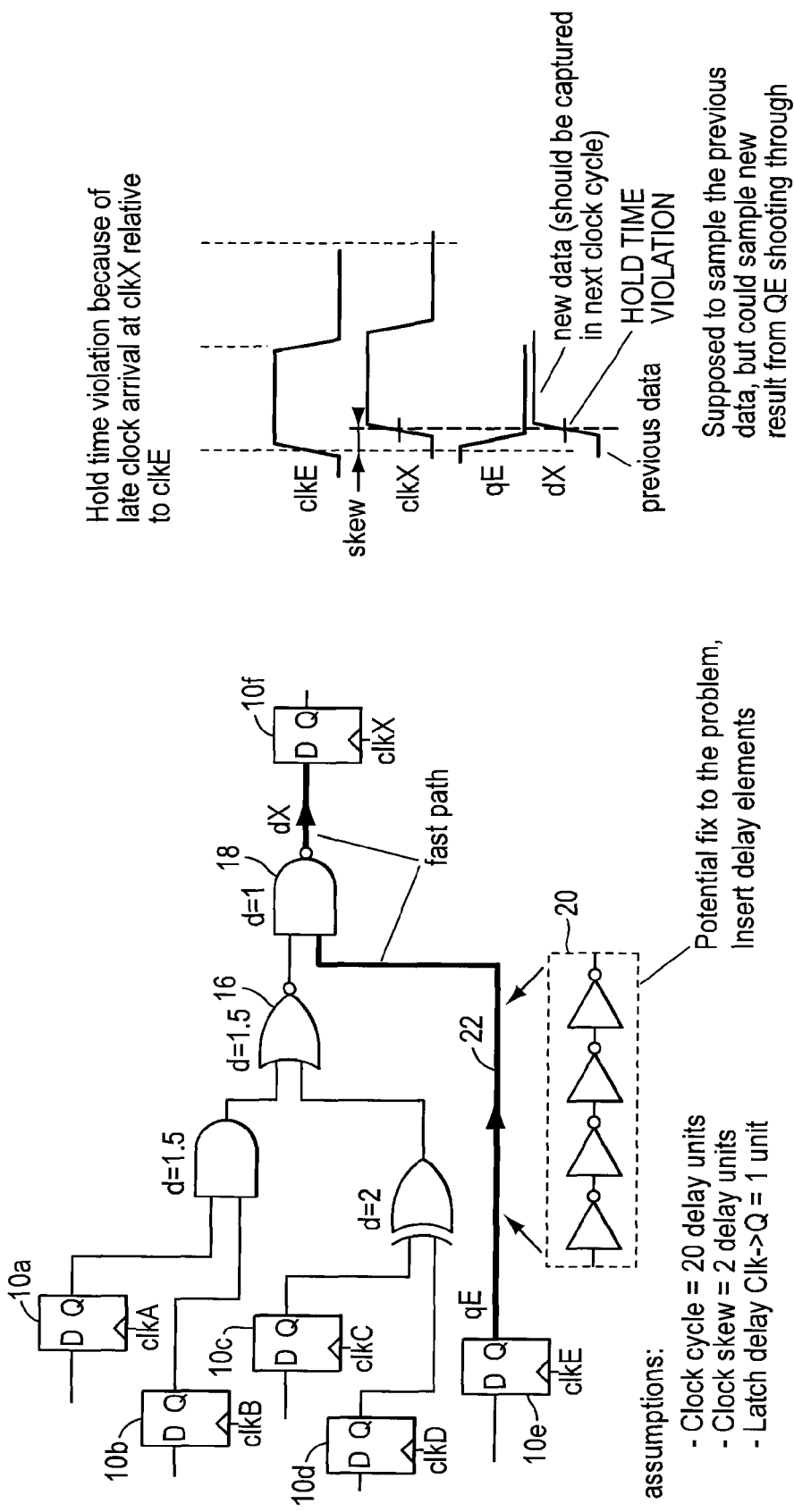
FIG. 1 illustrates the hold-time problem when there is a data fast path.

In one embodiment of the present invention, an existing chip is retrofit with a rotary clock. This helps to close timing, hardly affects placement, requires a few wiring changes. A snake router is used.

The starting point for Rotary Clock retrofit is a finished physical chip design, created using standard tools and CTS (clock tree synthesis tool). This chip typically has been synthesized, designed and timed based on the assumption of single-phase clocking scheme with edge-triggered DFF storage elements. The design need not meet timing (Static Timing Analysis) as designed as the insertion of Rotary Clock can solve many of the timing violations.

In this embodiment, the existing chip design is first loaded into the database. Approximately 0% to 5% of distributed "whitespace" on the active area should exist in the standard cell areas of the design to allow for insertion of Rotary Clock cells. Sometimes the required area can be gained just through removal of existing clock-tree components. In other cases, the inefficiency of common P&R tools usually has left sufficient whitespace. Optionally, some decoupling capacitors can be removed to free the required whitespace as rotary clocks cause less switching noise and lastly, filler cells (which are commonly added to a design to allow post fabrication circuit changes through metal-re masking) can be reduced in number.

Next, the locations of the elements to be clocked, such as flip-flops, are identified and recorded. A graph tree walker can be used to do this. The identified elements are targets to connect to the rotary clock by the rotary wire autorouter. Possibly the wiring to the flip-flops is removed.

Next, the rotary clock active circuits are inserted after the sites for insertion of the rotary clock components are identified.

Following this, the wiring for the rotary clock is generated by running the rotary clock autorouter.

Finally, a shield for the rotary clock is inserted. Railway sleeper wires go in to any unfilled metal area. A routine in MW or OA is used to do this.

In another embodiment, a new design, for use with a rotary clock, is started. The present invention includes a synchronous fabric. In a previously filed rotary clock patent application, Great Britain application GB0203605.1, filed Feb. 15, 2002, and International Application PCT/GB03/000719, filed Feb. 14, 2003, a rotary synchronous fabric is described where the rotary clock wires and flip-flops are inserted first onto the chip layout before the logic gates. This makes sense because it minimizes the wire length for the clock wires (because the flip-flops are directly underneath the rotary clock wires). The clocks are always at least 2× faster in frequency than data wires (data signals only toggle with F at most ½ clock frequency), so some increase in the wire length between some of the logic (datapath) cells is tolerable (in terms of power) if pre-placement of flip-flops results in sub-optimal standard cell placement.

In the present invention, the synchronous fabric is improved to include (i) logic path 'min-sizing,' (ii) buffer (pre) creation and instantiation into fabric, (iii) VDD/VSS prefabrication and exploitation, (iv) a decoupling capacitor provision (and other VDD switching, conditioning), (v) SerDes links in the channels, (vi) a Scan and Test feature, (vii) single-step in the channels, (viii) regenerator/tuner cells in the channels, (ix) startup circuits, (x) eddy current loop elimination in the fabric to allow 'wide-wires' for lowest power, and (xi) matching the circuit partitioning task with the rotary grid natural partition (synchronous partitioning).

The general idea of the synchronous fabric is to reduce the design effort and risk of gigahertz speed design by provide a 'pre-designed' infrastructure for all the most difficult parts of logic design, power, clock, and long-range wiring. A pre-laid fabric is instantiated on the chip first. The fabric occupies an area arranged in X,Y rows and column strips. Areas can be de-populated by making holes in the fabric (e.g., for SRAM blocks). The useful resources within the channels are then available 'all-over' within a design.

Logic Path 'Min-Sizing'

In this flow responsibility for cell sizing is taken over from the logic synthesis tools. Instead of gate sizing, buffering on a minimum-sized logic circuit, produced by a basic largely non-physical logical synthesis tool, is implemented. This approach has many advantages including the simplification of the cell library (only one cell for each type, no need for range of sizes), simplification of the synthesis tool, i.e., it doesn't have to consider sizing and doesn't need to be a physical-synthesis tool, deferring of buffering until after layout when the actual buffer requirements are known, allowing for automatic pipelining of wires (or suggestion of pipelining) and equalization of path delays, and placing of buffers, both conventional (CMOS inverters) and synchronous repeaters (latches), in the "Rotor Channels."

Logic Cell Placement in the Fabric

Most placement tools respect the initial blockages of the rotary-channels and place the Min-sized logic cells between the rows of Rotary channels. (Use of blockages in DEF syntax). Flip-flops and latches are removed from the netlist because these are provided 'allover' by the rotary fabric (see U.K. application GB0203605.1, filed Feb. 15, 2002, and PCT/GB03/000719, filed Feb. 14, 2003). Given the known possible phase locations on the clock on the rotary wires, the placement tool uses weightings to make sticky locations for a logic cell whose output connects to a nearby flip-flop with the correct (or almost correct) phase.

Routing and Buffer Insertion

Detailed routing after placement is either unbuffered (logic cell to logic cell) where the distance is very short or is buffered by the fabric to the correct drive strength for signals of more than a certain length (say, greater than 200 um) or load. Clock routing is not required since the clocks are encapsulated by the fabric and data signals coming into the channels are latched (or edge-captured) and come back out of the channels. Mid-range local routing (greater than 200 μm but less than 0.5 mm) generally requires buffering of the output signals from the min-sized logic gates. This is implemented by using an optimal cascaded buffer chain whose stage sizes are calculated from well-known equations. Global routing to more distant circuits can be implemented with the following options, (i) buffer (conventionally) uncertain delays, (ii) synchronous repeater (clocked buffer), multi-hop certain delays in ½ or ¼ clock cycle increments without losing synchronization; effectively this is "pipelining the wires," and (iii) "lightspeed wire." There are two sub-options for the latter item, either a single lightspeed wire per databit, or SerDes for multiplexing multiple signals over the wire. Based on analysis of the layout and the potential options above, the "fabric configurator" tool switches-in components to the fabric that can implement the signaling resources available. Note that for ASIC flow this is a design-time configuration, not a run-time option. The netlist is modified so that a conventional router is left to connect the points. (Internal representation or structural Verilog-Netlist is modified but does not need to be passed back to the Verilog RTL source code, which can remain the same). The choices of when to use buffer insertion, pipelining of wires, pipelining of paths, latch insertion for hold time safety, are pushed down to the CAD tool.

Feedback of New Pipeline Info to the Verilog Code

A feedback path from placement to Verilog code would be required if the tool flow determined that insertion of additional pipeline stages were required to meet the target speed. This might break the design. So, the tool feeds back, in a report file, the options where pipeline stages could be inserted to the designer who is responsible for changing the RTL source.

Hold Time Violations Relating to the Fabric

For standard single-phase, edge-triggered D flip-flop (DFF) based synchronous circuits on modern processes, clock uncertainty can often cause hold time violations in synchronous paths. In earlier generations of digital circuits, the term hold time used to refer to a DFF specification, i.e., the small time the data must be stable after the clock edge for the DFF to properly sample the data. Nowadays, DFF designs usually have zero or negative hold-time requirements and the term hold-time violation is re-defined to indicate a problem when the D input to the FF changes just before the clock edge comes. This is caused by a combination of relative clock skews and fast data paths, causing sampling of result of the new state (not the previous state as DFFs are supposed to sample). The typical cause of hold-time violation is a clock signal that arrives at a receiving DFF too late relative to the sending FF clock edge (because of skew) and a fast data path evaluating a new logic state within the skew time. Thus, the new state is sampled by the receiving FF with its delayed clock edge. Hold issues are especially problematic for fast paths in which there is little delay in the data signal resulting in less tolerance to skew. FIG. 1 illustrates the hold-time problem when there is a data fast path 22. The fast path 22, with signal qE, can change the input dX to the flip-flop 10f before the previous state is sampled by clkX. It can be seen that the other signal paths are not subject to the same problem, because the delays from the output of the flip flops 10a-e to the point where the data is captured are greater than the skew, thus ensuring that the previous result of the logical operation is captured correctly and sent forward by the receiving FF 10f.

Integrated CAD tool flows are generally able to identify hold violations automatically through timing analysis over expected process, voltage, and temperature (PVT) variations. The most common fix for hold-time violations is to insert delay cells (e.g. inverters 20, as shown in FIG. 1) to slow down the fast data paths 22 sufficiently that the DFFs 10a-f are sure to receive their active clock edges before their D inputs (from the preceding logic stage) change. Up to 30% of the cell count can be hold-time-fixing inverters. One other partial solution is to downsize the cells (select lower output-drive versions) in the fast paths, but this can negatively impact the speed of the slower path also.

The synchronous fabric approach of the present invention gives control over the buffering elements (drive adjust) and also over the connection to the abundant synchronization elements. A new option of inserting level-sensitive latches 24 (or DFFs) to slow down fast paths and fix hold time problems is shown in FIG. 2. This becomes practical on a Rotary Clocked chip, because power does not increase greatly by adding clocked elements. FIG. 2 gives an example of an alternative approach to equalizing delays in a circuit. The example is simple (and could probably be implemented better by just choosing a different phase for clkE), but serves to show that a timing imbalance can be controlled by insertion of clocked elements into the circuit, after the circuit is defined. These extra latches do not add pipelining stages; they are just used to equalize delays of the paths so that hold times are not violated. (See also Partitioning section where similar method is also used.)

The cases in which insertion of FFs (or latches) is actually pipelining or in which the insertion is just the equalizing of delays depends on whether a full clock cycle or a fractional clock cycle is used (because all pipelining is doing is equalizing delays). The distinction comes down to whether the equalization of delays is balanced well enough to permit multiple packets of signals to move through the path without mutual interaction between the packets at a higher frequency than before the change. If so, then pipelining is present.

Constructive Closure of Timing

This section applies all the design freedoms available in the Rotary Flow in an attempt to make a straight-line design process with minimal or even zero timing closure iterations. (See later for definition of timing closure). Most synchronous ASIC design flows require what is known as "Timing Closure" iterations. The basic problem is that assumptions regarding wireloads early in the design process (which slow down circuits) are not the same as final wireloads when the circuit is placed and routed. If a circuit fails to meet timing because some critical path exceeds a cycle time, a new iteration of Place/Extract/STA (Static Timing Analysis) is needed.

Newer tools can use techniques, such as cell sizing, retiming, clock skew scheduling, and extra placement passes to try and fix critical path faults. Unfortunately, re-spinning the design through the tool chain can often make previously non-critical paths suddenly become critical and the timing iterations sometimes do not converge.

Rotary "Constructive Closure " Flow

If buffer-sizing, hold-time fixing, and clock skew scheduling are performed at the same time as place-and-route in an incremental way, circuits of arbitrarily large size can be built without timing convergence issues. Placement and Routing can be applied incrementally, one path at time. Clock phases are chosen to correctly match the worst-case logic delays and tradeoffs between communicating pipeline stages spread the logic burden asymmetrically between pipe stages. Useful skews of up to ±25% of a cycle can be used. This gives a maximum period between system DFFs (or pseudo DFFs) clocks of 1.5 times a clock cycle, and a minimum period between system registers of 0.5 times a clock cycle. Also, useful data-skew can be provided by SerDes sampling points.

Perpendicular Clock Tap-Bars

The fabric provides many possible sites for clock lines underneath the main rotary clock wires. Additional routing of rotary clock tap stubs 30, 32, 34 can be made available in the perpendicular direction, as shown in FIG. 3. These are especially suited for furnishing clock signals for hold-time fixing circuits within the main non-fabric areas usually used for logic gates. Known-phase clock 'sites' where latches can be inserted are then available to the placement CAD tool. Using the sites outside of the pre-assigned fabric where clocks are still easily available reduces the wirelength of many nets (by requiring that wires need not extend into and out-of the Rotary-channels) and gives the opportunity for running the datapaths left and right as well as up and down. Typically, but not necessarily, the perpendicular clock bars 30-34 drive the pipeline, non-scannable and hold-time-fix circuits, which often operate during the 'Management rotation.'

True Edge-Triggered FF Design

FIG. 4 is an alternative low-clock-capacitance, direct-drive DFF, which has a true edge-triggered sensitivity. It is driven directly by the rotary clock. Positive or negative edge-triggered operation can be selected by alternating the differential clock connections 50 52, which connect to 58 60 respectively. The circuit is compatible with standard-cell libraries. "Effective" clock enables (via ngate 40 and pgate 42 to 54, 56, respectively) are shown in the figure. Edge sensitivity is achieved by the positive feedback transistors (nfb 46, pfb 44) which activate on the high-period of CLK 50 and are strong enough to override any externally asserted input, because of the series resistor 54 in the D input path 48, which connects to 62, 64 and 66, 68 respectively. The decision of the state is made very quickly after the positive edge of the clock 50 and cannot be altered until the CLK 50 goes low and then high again. The input resistance 54 can be varied to give some effective hold time extension by slowing down the input signal when this is needed. The output *Q is driven by transistors qpb2 70 and qnb2 72.

Partitioning Groupings

Figure 14:
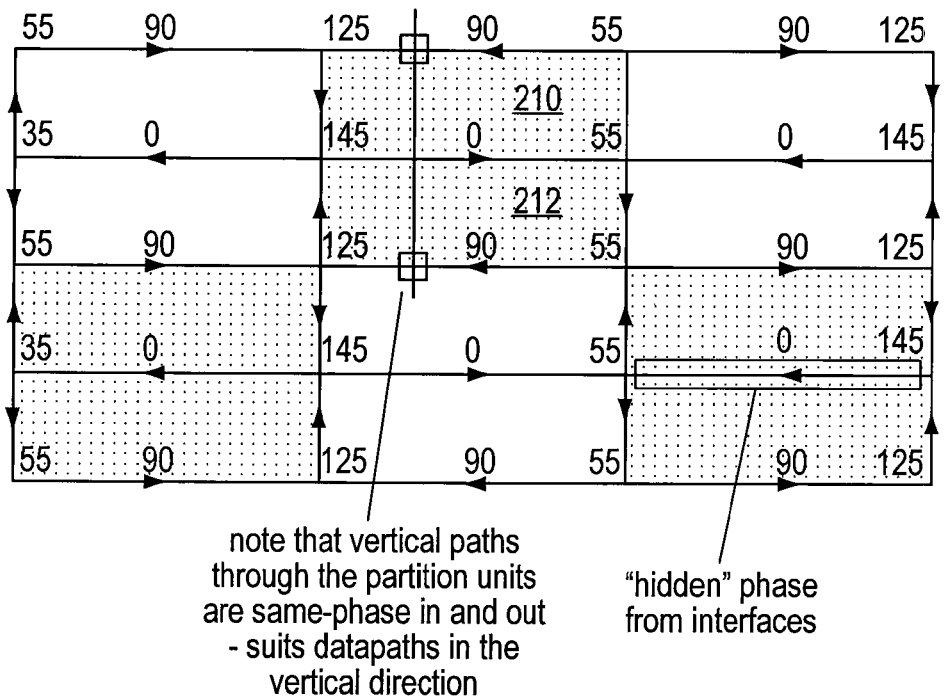
FIG. 14 illustrates a layout for reducing the amount of rotary phase 'visible' at the registered-out borders.

To help solve hierarchical level inter-region clock constraints, the layout of FIG. 14 reduces the amount of rotary phase 'Visible' at the registered-out borders by combining pairs of rotary loops 210 212 to be the partition unit granularity. Un-shaded and shaded pairs are illustrated.

Pulse Latch Using a Four-Phase Clock

Figure 5:
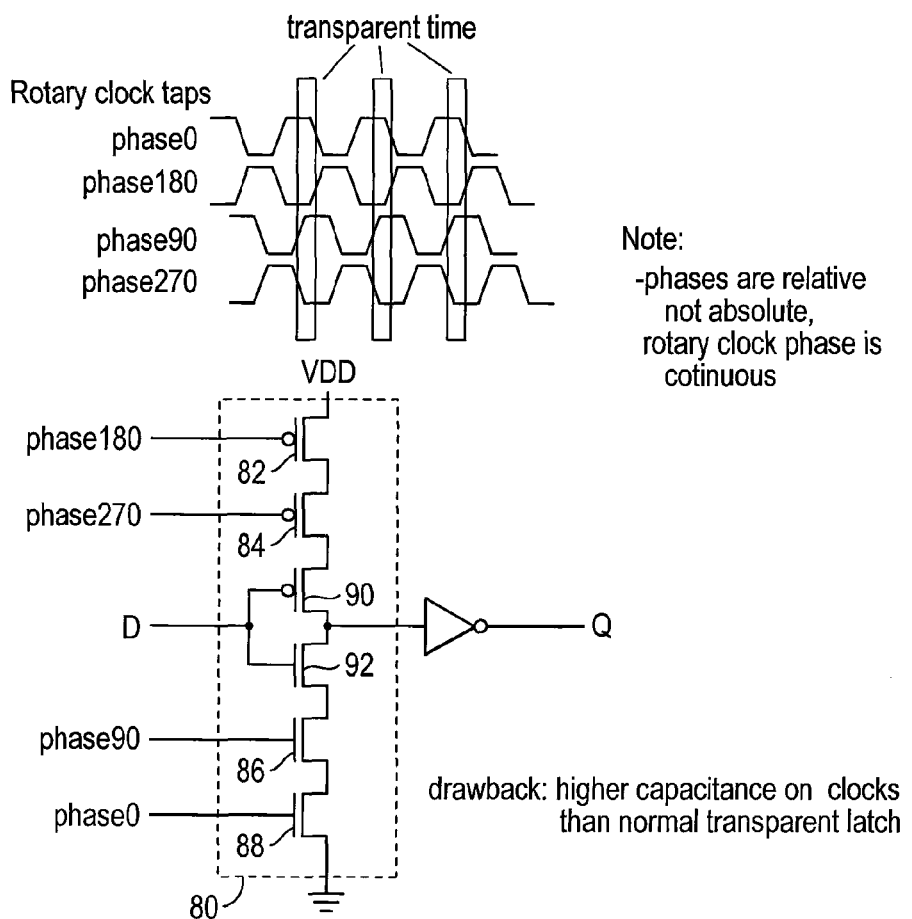
FIG. 5 illustrates a 'pulselatch'.

To build a pulse latch one ordinarily needs a monostable pulse generator. An alternative is shown in FIG. 5, which shows a series-connected sampler circuit 80 active on only ¼ of the clock period to couple the D input via 90 92 to the Q output. This circuit suffers from two problems relative to a two-phase standard (half-latch) transparent style of latch. The first problem is that it is slightly slower, because of the extra FET in series. The second problem is that there is more capacitance, because the rotary clock is loaded in four places 82, 84, 86, 88 instead of two.

Eddy Loss Elimination Through Fabric and VDD, VSS Wiring

Previous patent applications (PCT/GB01/02069, filed May 11, 2001) focused on elimination of eddy currents in the wiring underneath rotary clock wires. One example is the 'railway-sleeper' shield configuration. This methodology is expanded here to allow for reduction of induced voltage loops and therefore of eddy-losses in the active pre-fabricated cells (see previous list of cells).

The motivation here is that to improve efficiency of rotary clocks resistive losses should be reduced as much as possible. Wide wires minimize the resistance of the wiring to optimize L/R ratio, which determines power losses. Additionally, to maintain a reasonable L, the rotary wires, which are differential, have a separation of about the same distance as the width, perhaps a width of 40 micrometers or more, and this implies a similar separation. Although this can lower power consumption, there can be problems in widening wires. For a differential pair, strong magnetic field interactions operate at distances of approximately the same order as the separation between differential wires.

On VLSI chips, the metal layers are at most 10 μm to 20 μm above the active layers and this means that wide wires will couple magnetically to the active substrate. This could cause a problem, because conductive circuits below the wires might experience interference from the magnetic signals from the rotary clock. [Ref JSCC paper 2001]. Also, any conductive loops in the wiring below the clock will resist the imposition of the magnetic field in the clock wires by forming eddy currents, thus reducing inductance, increasing losses and complicating the analysis. Given that the fabric circuits directly underneath the rotary wires (the Rotary Fabric channels) are under direct design control, circuits can be constructed to minimize any problems. Some of measures shown in the diagrams are data wiring configurations, VSS wire construction and connection points, and flip-chip bump avoidance.

Figure 6:
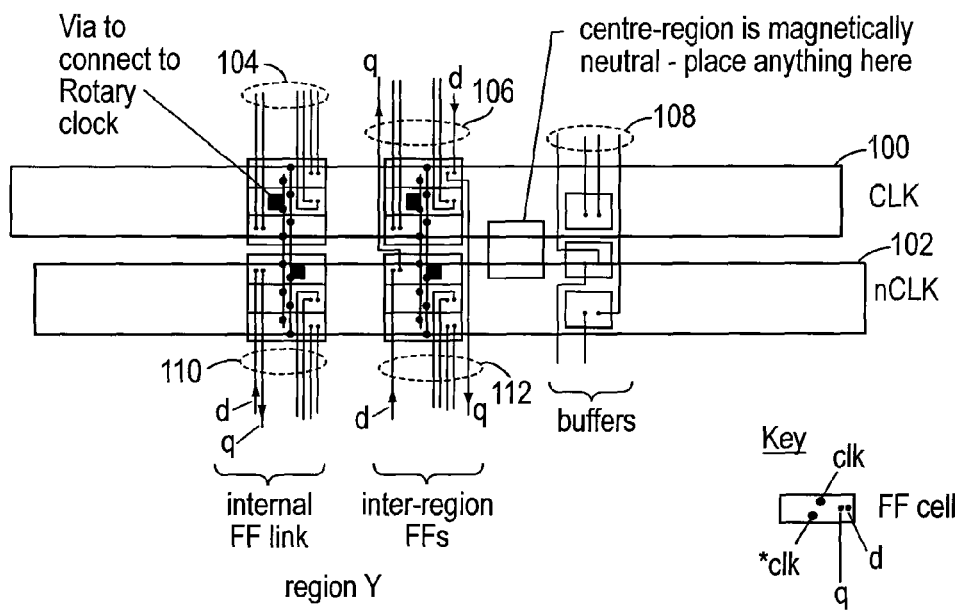
FIG. 6 illustrates eddy current loop minimization layout techniques with respect to the clock.

FIG. 6 shows the use of data wiring configurations in which wires 104, 106, 108, 110, 112 enter and leave the channels (for buffering, synchronizing etc) at a 90° angle to the direction of the clock wires 100 102, which prevents magnetic interaction. Also, special layout precautions are applied for the Rotary-specific cells (e.g., regenerators, repeaters, tuning cells) for each of the rotary cells to be used inside the channels), except at the center-line (magnetically neutral) point, shown in FIG. 6, where there is no net magnetic field from the clock lines.

Figure 7:
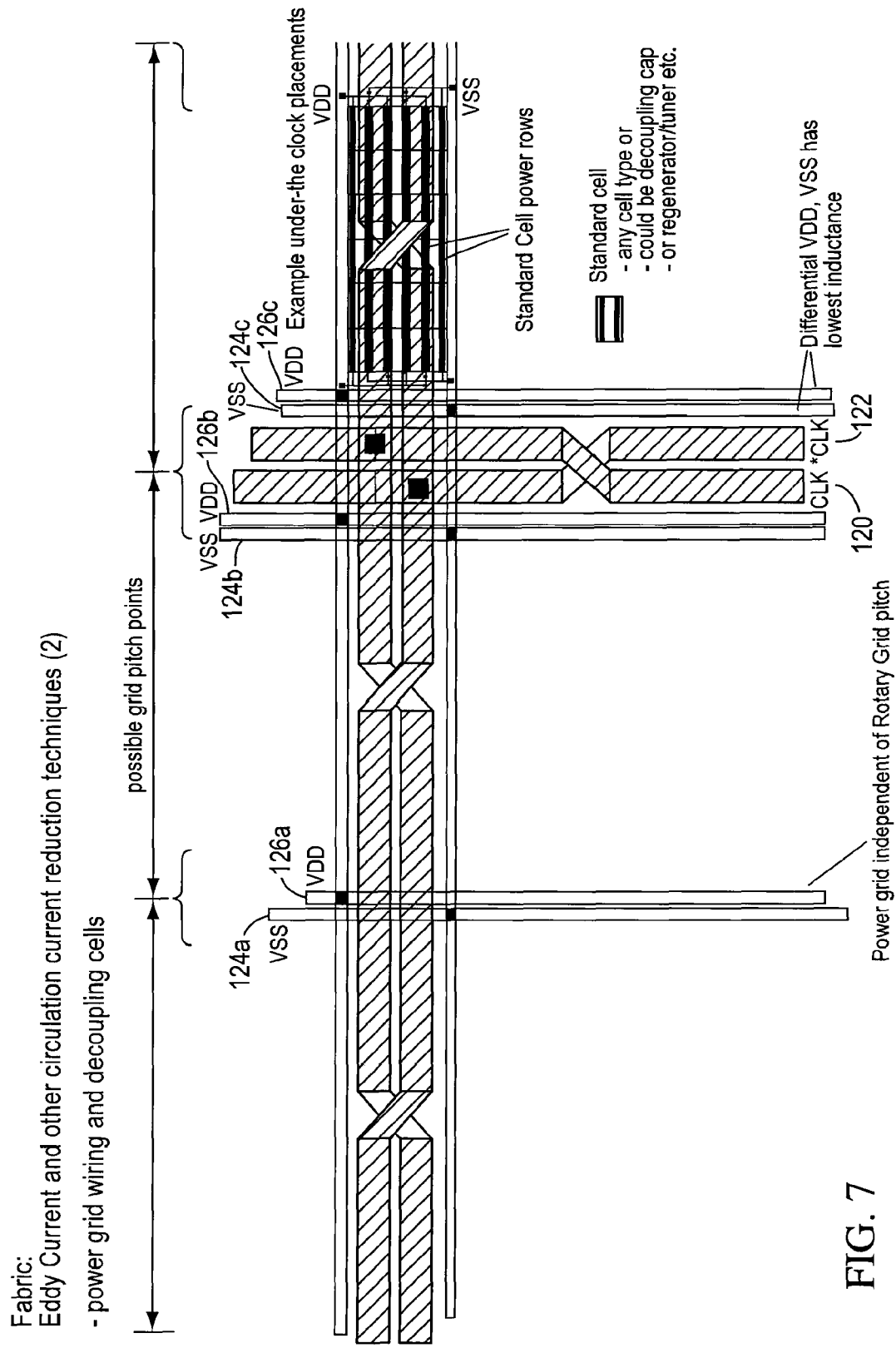
FIG. 7 illustrates eddy current reduction with respect to VSS and VDD.

FIG. 7 shows how the VDD,VSS wire construction 124*a-c*, 126*a-c* and connection points are used to prevent circulation currents under the Rotary clock wires 120 122. The VDD and VSS wiring on a VLSI chip is typically arranged in grids to give a low impedance power supply. Magnetic (and to lesser extend electrostatic) interactions can occur when the power lines and clock lines are in close proximity, so the software tool that creates the clock wires co-generates VDD and VSS wires and decoupling structures. Adhering to rules shown in FIG. 7 ensures that the voltage potential gradients induced on long VDD and VSS wires mostly cancel, because of the twist in the Rotary clock wires. For the avoidance of lossy circulating currents, the VDD and VSS lines for the standard-cell rows are not connected other than where shown at the ends. Decoupling capacitors can be inserted at any of these standard-cell placement locations. Note that for standard cell rows that are situated well away from the clock wires there are no such restrictions on VDD, VSS layout.

Often the X/Y pitch of the fabric must be chosen to fit in with other constraints. Typically, for a flip-chip mounted device, regular bumps are present on the upper metal layer and any clock wires need to pass between these bumps. To avoid flip-chip bumps, an interesting pattern of zig-zag layout shown is used. This cancels electrostatic and electromagnetic coupling to the bumps and is an alternative to the X/Y rectilinear grid. As an example, given a 200 um wide channel, 20 um power, 60 um clock, 40 um gap, 60 um clock, 20 um power, and an area usage of 20% that includes decoupling, buffering, clocking, global signaling, the column pitch should be 1 mm.

Magnetically induced electrical potentials cause eddy currents and upset logic circuits. The induced noise potential depends on the velocity of the transmission line and the signal rise and fall times. Both parameters can be optimized to minimize the noise in the first place. Another factor that has the potential to upset logic is noise generated during switching times (rise and fall times). In synchronous systems, this might not matter if the FFs capture the state before the noise period. For interference in the other direction, i.e., logic values causing induced signals on the rotary clock wires, there generally is no jitter induced in the clock where the logic signals transition during the time periods where the rotary clocks are locally at the logic rail potentials. (VDD/GND/Rotary wires, Vias for structured ASIC. Reuse vertical bars which are normally for frequency adjust, for VDD/VSS connections.)

Split Supplies Of SOI, Level Shifters

A serious problem on low voltage CMOS (VDD-1 volt) is the distribution of DC power at this low voltage. Supplying 30 watts at 1 volt requires a 30 amp power supply. Voltage variation is inevitable with the non-zero impedance of on-chip power distribution wiring and just 100 mV of supply dip at 1 volt translates to 10% signal speed variation in the logic.

Figure 8:
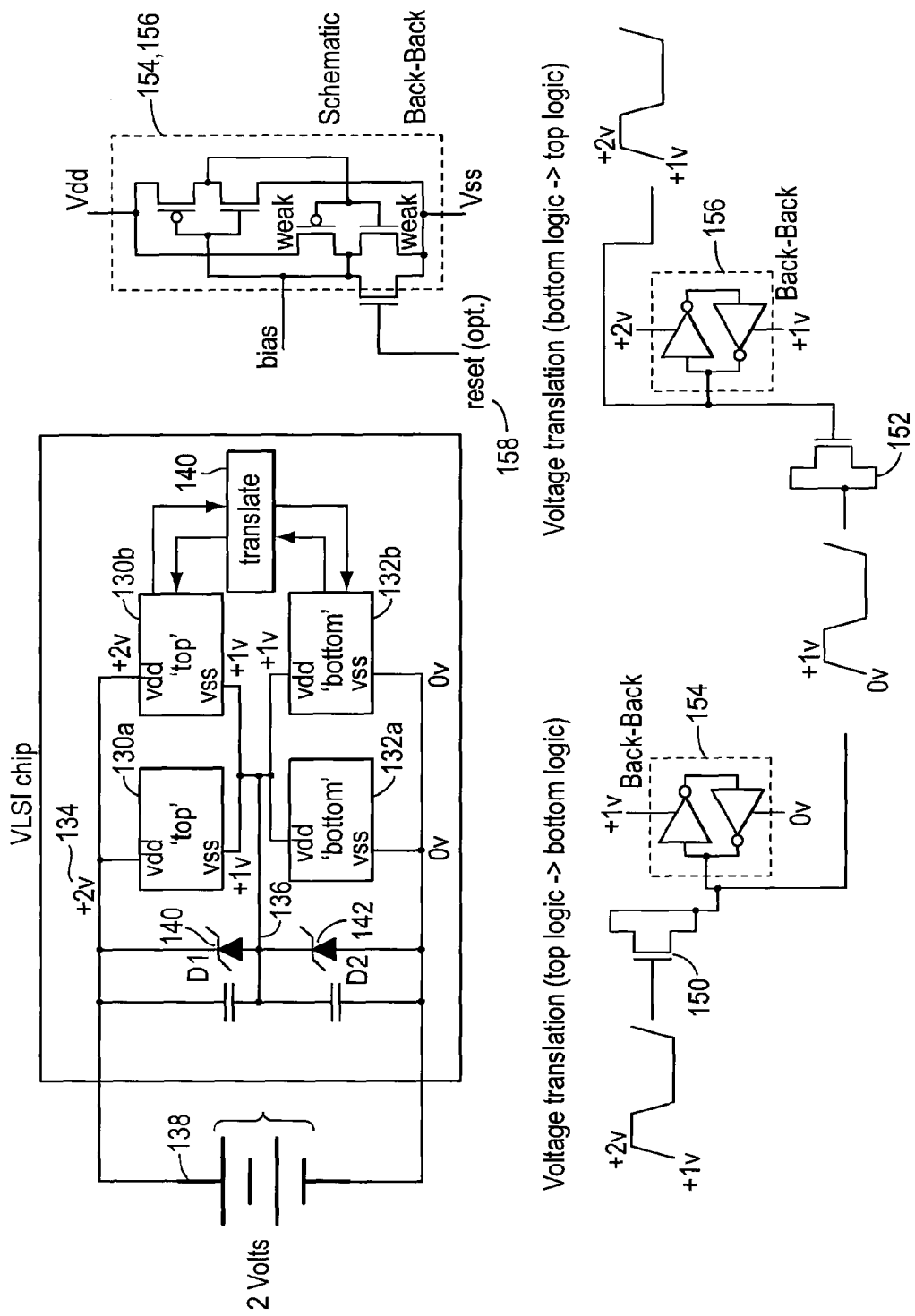
FIG. 8 shows circuits that allow SOI (Silicon on Insulator, especially) processes to work with effectively two (or more) DC power distributions "in series" on the chip.

FIG. 8 shows circuits that allow SOI (Silicon on Insulator, especially) processes to work with effectively two (or more) DC power distributions "in series" on the chip. The logic is divided into two groups, "Top" 130*a,b* and "Bottom" 132*a,b* (which can be freely intermingled rather than just as illustrated), the two supplies 134, 136 being in series with the applied 2 volts 138. Assuming that the supply currents in each section of the logic block are equal, then diodes D1 140 and D2 142 (Zener or other clamping diodes or other shunt regulator devices) with a 1 volt setting have nothing to do (no current) and the supplies are naturally split in two, with 1 V as the VDD for all logic blocks. The advantage now is that 30 watts requires a delivery of 15 amps at 2 volts making power regulation and distribution easier and less lossy. A final advantage is that 2 volt circuits could be used, say for highest speed logic blocks, and I/O usage. In some circumstances, the reverse bias might be useful, e.g., for analog circuits which could view the rails as ±1 volt. Alternatively, the reverse bias could be used to help turn off digital transistors with excessive drain 'off' leakage.

Voltage translators 140 between the two Top and Bottom powered blocks are also shown in FIG. 8. With SOI transistors, ideal capacitors 150, 152 are created by Nmos or Pmos transistors always operating in enhancement mode. Back-to-back inverters 154, 156 are the circuits that provide the DC bias point between switching events. The Nch and Pch of the bias inverter 154, 156 can be very small, as the currents required for bias are just leakage currents. There is a negligible speed, power or area penalty for these simple translators where the coupling transistor gate area (sets C) is sized according to the capacitive load on the receive net. Partitioning the circuit into two VDD regions can be done using a "Min-Cut" or other circuit partitioning algorithm, such as Hmetis or ML-Pan, as known in the literature, coupled to the expected supply current in each logic block to minimize the amount of wasted power in the shunt clamping devices D1, D2 or other similar devices.

The above system can be extended to 2 to 3 or more splits in supply voltage, as necessary. Bulk CMOS could be used, but is less than ideal because of the substrate bias effects on the transistors operated with strong negative substrate-source voltages. Initialization of the level-translators is optional. Where necessary, the reset input 158 can be asserted when it is also known that the transmit side is in the low-output state, e.g., during a system reset. With definite initializations, the first low to high transition from the master is sure to be reflected in the receiver. Without a definite reset, it may take a complete low to high, high to low, low to high set of transistors before the receiver then follows the transmitter data, as shown in FIG. 8.

Where the partitioning is synchronous partitioning (see section on partitioning) (i.e., cutting the circuits at the flip-flops and/or inserting flip-flops at the cut points), the voltage translators operate on synchronous signals that are guaranteed to be glitch free, thus eliminating the risk of faulty signal passage. (Combinational logic signals can spend significant time operating in the uncertain logic level region and the outputs are often non-monotonic).

This method is superficially similar to "Voltage Islands," in which regions of circuitry operate on different supply voltages, but usually have common VSS connections and only the VDD supplies differ. Voltage islands can be used here also.

Serdes Links, Transmission-Line Links

When inductance of a signal wire begins to make an impact because of frequency or length, the flow of the present invention flips the problem and makes use of the inductance to good effect; the conversion of the wire from RC mode to a real transmission mode makes use of the inductance to reduce power and increase interconnect velocity a factor of eight.

Precompensation Driver

A simple improvement on the SerDes driver accounts for any slight history from the previous bit transmitted (this occurs when the gaps between bits are compressed to a minimum). This is a well-known technique and is applied here in the following way. By storing the last bit sent down the wire (in a state element), every time the data changes, it is possible to increase the current drive to the output stage for the new bit to help override the artifacts of the previous bit. When the data doesn't change (or for the first bit), the lower level drive current is used.

Sample/Subtract Receiver (Alternative to Precompensation Driver)

Figure 15:
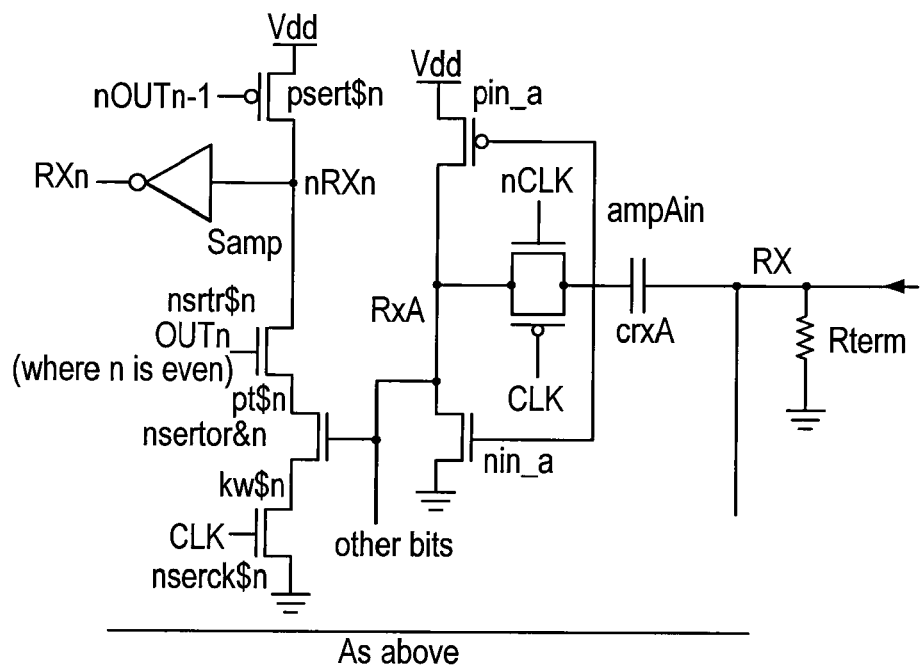
FIG. 15 illustrates a receiver that has two counter-sampling receivers, each operating on alternate clock phases.
Figure 16:
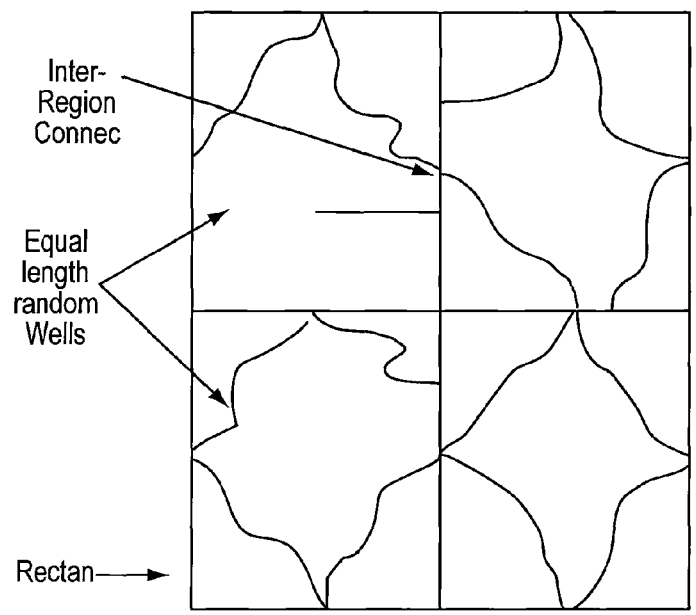
FIG. 16 illustrates random walks.

Alternative to a Precompensation driver is shown in FIG. 15. This receiver has two counter-sampling receivers, each operating on alternate clock phases. It responds only to the change in input level since the last ½ cycle sample and therefore, does not need a precompensation driver, but instead just highly phase-correlated TX and RX clocks signals.

Crosspoint Switch

On chip SerDes links are often used to reduce on-chip wiring of parallel busses and minimize congestion. Crosspoint or multi-access selection of busses is a common requirement, for example, for sharing expensive resources such as on-chip cache memory. It is certainly very much easier to perform digital-selected crosspoint routing with serial lines. Physical area on the active layers is improved by more than just the factor of the width reduction.

Software Support for Identification of Potential Serdes Links in Verilog (or Other High Level Design Language)

Busses are often explicit in the Verilog high level descriptions of the circuits. Typically, a bus has a name such as Data[0:15], which is easy to recognize with a Verilog parser. In other cases, the circuit partitioning code 'cut' a circuit at points where SerDes links could be inserted to rejoin the circuits. Placement of circuit partitions that have been separated by SerDes links have more freedom of placement on chip subject to only (approximately) 6 ps per mm latency due to separation by the transmission-line link (on top of the fixed electronic latency).

Useful Data Skew (More General Concept Than Just on Serdes) Multiphase (Data Multiphase) Aspect of Serdes Links Transferring multiple data bits using a high frequency global clock with the time period of the low speed clock (indirect drive mode) makes the bit send and arrival times seem like multiple-phase events with respect to the low speed clock cycle. The simplest way to handle this is to transfer a complete parallel word into the serializer at once, and transfer out the complete word at once based on two consecutive low-frequency clock events.

Better use can be made of the multi-phase aspect if the bits can be used as they arrive. Through investigation of the timing graph of a circuit, it will be apparent to an algorithm writer that the first-bit to be sent/received should be used for the data which requires minimum latency. Other bits can be assigned in delay-time-tolerance order with the last bit of the SerDes sequence perhaps being used for a low speed control line.

Useful Data Skew as a concept can be over a full 360 degrees of phase. Data is already skewed all over the place due to delay variation and crosstalk etc., so there are no difficulties in absorbing the SerDes skew into the timing analysis framework.

Stall Logic Transmission-Line

Figure 11:
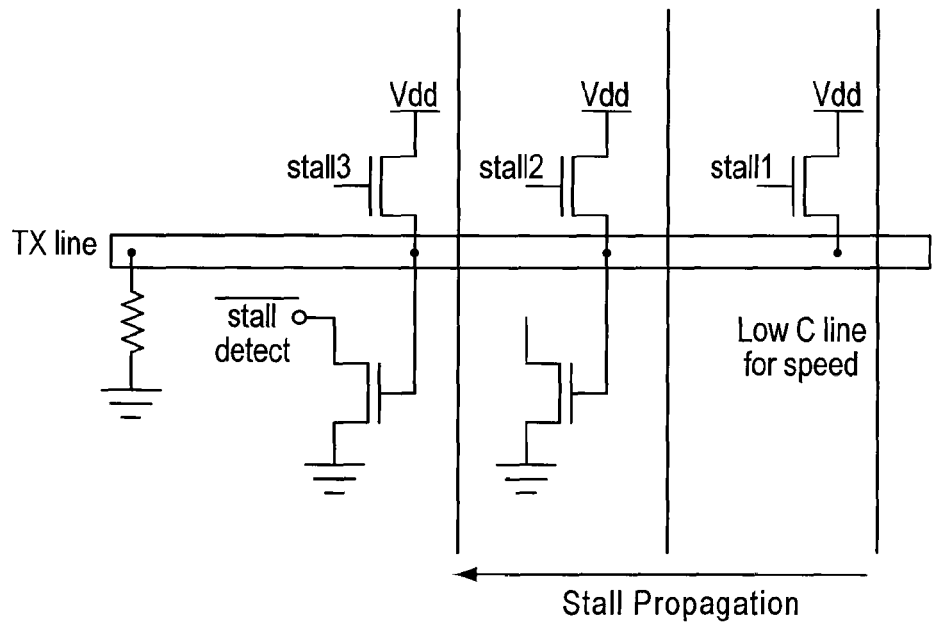
FIG. 11 illustrates transmitting a stall signal down a pipeline to preceding stages to overcome the slow repeater-speed limitations.

FIG. 11 shows that another application of transmission lines to overcome the slow repeater-speed limitations is to transmit a stall signal down a pipeline to preceding stages.

Partitioning

Partitioning is important for various reasons such as timing analysis, placement, and Register insertion into Rotary Grid regions, SERDES links. (See also ACTIVE/QUIESCENT rotation description). Partitioning of circuits is a vital step in many EDA CAD algorithms. It breaks large circuits down into smaller more manageable pieces and corresponds to the 'divide' step in a divide-and-conquer approach. One common application of circuit-partitioning is in the placement step, to break down a circuit into smaller pieces, each as self-contained as possible (with minimal mutual interconnect) each of which can be placed independently on the artwork of a chip. Of the circuit partitioning techniques, "Min-Cut" (ref: HME-TIS) is the most popular. The goal of the partitioner is to minimize the number of nets (interconnects) that are "cut" by the partitioning process.

With Rotary clock (direct drive), the placement and consequential circuit timing imposed by flip-flop insertion makes the placement and clock-skew scheduling tasks tightly interrelated. The pre-placed flip-flops are in a regular grid pattern underneath the Rotary Clock loops, so that it is possible to use this regular grid structure as the partitioning template for the circuits.

Partition the Circuit at the Flip-Flops

A clustering algorithm (or coarsening phase as it is called in partitioning parlance) is used to group only non-sequential items, then each of the flip-flops is in its own partition at the end. Placement then follows. Several partitioning codes support the concept of edge weights. (Reference CHACO code, a tool which allows edge and vertex weightings). By setting the edge weighting of the outputs of flip-flops to be zero and all other edges to be higher (much higher perhaps) the tool cuts the netlist mostly at the outputs of the flip-flops (the desired effect). It is better to have global nets to be registered outputs (rather than registered inputs), because registered outputs when fanning out into the higher level hierarchy are more timing certain. This helps tools to avoid crosstalk and to check timing, if global nets have known timing.

Equivalence of Registered Inputs to Registered Outputs

There is really no difference really (except global nets), just where you draw the line. Registers are single-input, single-output so for most partition points, the partition line can be moved back. If cut has to be made in a logic path, a flip-flop is added with correct phase to make it into a registered-output flip-flop. The correct phase can be inferred by performing a timing analysis on the combinational path up to the point where the flip-flop is to be inserted. All regions are fully synchronous and timing arc analysis (as analyzed by Static Timing analysis) does not need to cross boundaries. This keeps the timing analysis problem contained, and fast, and able to be undertaken by a cluster of CPUs with little interaction between the parallel codes. This also keeps the timing fully contained in the region, for example, skew scheduling algorithm, and timing analysis need not consider the internals of the other partitions. Preferentially, the fast portion of a path is chosen for the split, i.e., a FF is added where the additional overhead of FF has little or no affect on the speed of the circuit and might even be useful for fixing hold-time problems. This preference can be obtained by marking the edges of the graph (nets) with a low weighting for nets on non-critical paths.

Figure 12:
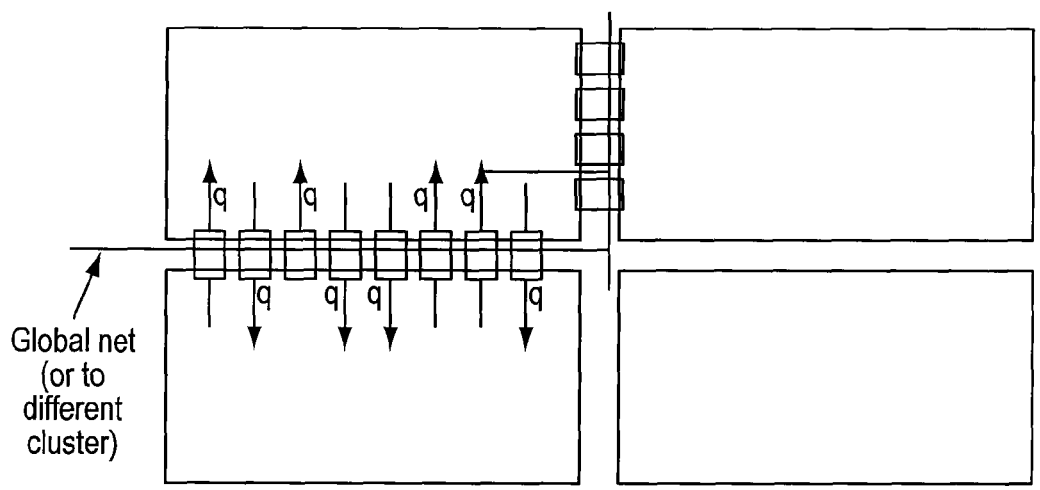
FIG. 12 shows how each partition is allowed to be optimized on separate Beowolf machines.

FIG. 12 shows how each partition is allowed to be optimized on separate Beowulf machines. The cuts are up or down possibly.

Serdes Links in the Partitioning Problems

Serdes link is like a strong hyperedge, it can provide multiple signals in a single wire. Useful data skew (which is implicit in the SerDes) can be taken account of.

Figure 13:
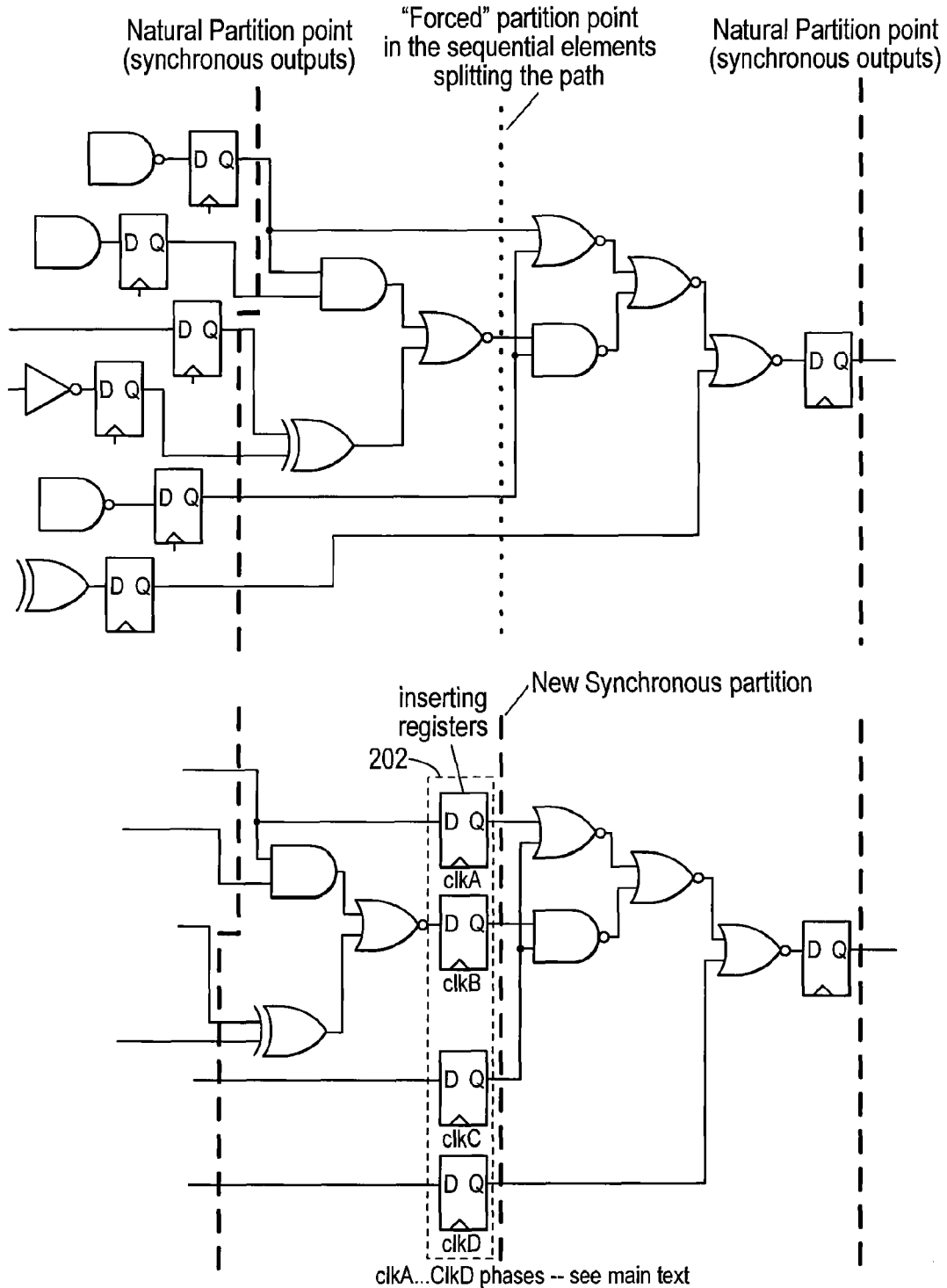
FIG. 13 insertion of FFs to make all partitions registered-out.

Example tool flow for partitioning using tools CGEN and CHACO tools—see refs:

CGEN
  Add a new routine to replace the BLIF netlist output and instead communicate directly in graph format with CHACO (There is a 1:1 correspondence between netlists and graphs.)
  Net (Netlist)=Edge (Graph).
  Cell(Netlist)=Vertex (Graph).
CHACO—Partitioning Software
  Couple CGEN and CHACO codes together to allow CGEN to give the graph to CHACO.
  Weightings:
    Edge:
      Encourage partitioning at the FF outputs (make the blocks "Registered out") by giving the FF outputs a very low edge weight—for low cost cuts, giving combinational logic a high edge weight—to dissuade cutting. Nets on the less critical paths can be given lower edge weights than those on critical paths to encourage components on the critical paths to remain inside one region and not incur the overhead of buffering or latching between regions. Global nets like VDD, CLK, Reset etc. should be removed altogether; they go everywhere so there is no point in trying to minimize the cuts in these.
    Vertex:
      Vertex weights reflect Area of cells. Set combinational cells to be the area of each cell in microns square. For FF set to 0. The FFs are pre-placed so we don't want it worrying about where to put them.
  Run CHACO
  Multilevel KL, Recursive Bisection mode as a 2D mesh with—X/Y of whatever the Rotary Rings grid is. Terminal Propagation is set to ON (See FIG. 13 for insertion of FFs 202 to make all partitions registered-out.)

The result file from CHACO will be a list of partition numbers for each vertex. The circuits will have been partitioned by this "coarse placement" step into regions corresponding to the areas bounded by the rotary clocks. The connectivity is not affected by the partitioning procedure, so the original netlist is still valid. Each region is now small enough and contains a sufficiently small number of cells that it can be auto-placed efficiently ("detailed placement") using the modified Timberwolf (ref) simulated annealing code outlined in International Application PCT/GB03/00719 (WO 03/069452)

Cuts in the Logic

Most of the "min-cut" inter-region communication will be by synchronous outputs (Registered outputs), but the FFs which were pre-placed in the fabric are not yet assigned to particular nets (this has to wait for the clock skew scheduling operation). The inter-region nets which are not registered-out (i.e., where cuts had to be made in the combinational logic) should be treated specially, and this is an inventive aspect of the approach as mentioned before (see further above). Division of the large circuits enables parallel processing on Beowolf clusters.

Refs:

CHACO (Graph Partitioning)

"The Chaco user's guide: Version 2.0", Tech. Rep. SAND94-2692, Sandia National Laboratories, Albuquerque, N. Mex, July 1995.

Terminal Propagation

"Enhancing data locality by using terminal propagation", Proc. 29th Hawaii Conf. System Sciences, IEEE, January 1996.

CGEN (Automatic Circuit Generator):

SYNTHETIC CIRCUIT GENERATION USING CLUSTERING AND ITERATION A thesis submitted in conformity with the requirements for the degree of Master of Applied Science Graduate Department of Electrical and Computer Engineering University of Toronto, Paul Daniel Kundarewich, 2002.

Timberwolf

FPGA Partitioning Across Multiple Devices

Closed Timing—Timing, Placement-Routing, Clockscheduling

Given the flexibility in placement, routing and clock scheduling, it should be possible to place and route one path at a time without requiring timing iterations.

Description (flow 2):

We work on this design and do any amount of optimization, like replace DFF with Latch (where timing allows) or implement a 'gated full speed methodology, but where full speed pulses are issued on demand for low effective speed;

Implement power wiring; and

Implement all global nets—clocks, busses, SerDes, lightspeed wires.

1. Floorplanning

Background

Place and Route covers the following topics:

Floorplanning (of fixed location items like I/O pins, or large pre-designed blocks Macros, RAMs which have some freedom of positioning); Macro placement; Placement of standard cells; Regenerator, Tuning cells (on rotary).

Timing Driven Placement

Iteratively arrange the clocks to the benefit of the clock scheduling Repeater blocks Obstructions (Also Known as Blockages)

There are two levels of P&R and Obstructions: (i) wiring level, where there exist obstructions like Pins, flip chip bumps, or pre-placed power and global wiring busses; and (ii) Active levels, where obstructions are macro blocks and the regularly-spaced 'red rectangles' which make a grid.

Often the two types of obstruction are independent and the jobs of placing Rotary wires, and Rotary Cells (active) is semi-independent. For example, if rotary clock wires are placed where the active area underneath is blocked (e.g., by a macro cell) then Rotary regenerator cells have to be placed outside of the obstruction and as close as possible to the desired rotary wire tap point. The rotary wires are usually up on top metal (e.g., M6) so to connect the active regenerators to the rotary wires involves intermediate wiring using M3, M4, M5 and vias.

For some macros, the wire and active obstruction regions become the same. SRAM macros and other circuits with sensitive analog components might be marked to give blockages in the Active and Wiring layers to prevent routing Rotary clock wires over these cells in case of fears (usually unfounded) of noise coupling into the analog circuits from the clock wires. A VLSI floorplan expressed in the LEF/DEF syntax from Cadence design systems has sufficient information to determine the blockage types and their shape and perimeter. It should be noted that loops and grids are ideal for beneficial for VDD/VSS wiring because of low impedance and that the finished design looks similar to the Grid layout in the previous SW application except here there is a grid that can adapt to blockage areas.

Clustered clock loads make problem much simpler, especially to evaluate all DFF to DFF paths for relative skew.

Double Clocking/Dual Supply Voltage Timing Analysis, with One Commom Clock Frequency Very low power CMOS circuits are nowadays designed to adapt to their dynamic processing requirements, by reducing operating frequency (F) and supply voltage (V) to save power when the computational demand is low (e.g., in a laptop computer when waiting for user input).

The motivation for both frequency and supply (VDD) adjustment is to address $CV^2F$ power at both the F and the V terms. Reducing clock frequency gives a linear power reduction, but reducing VDD gives a quadratic reduction in power. However, VDD can only be reduced after F is reduced, because the logic circuit speed is determined by VDD (speed is linearly related to VDD at high VDD). Frequency ratios of 100:1 are not uncommon, but VDD variation is limited to say 1.3 volts to 0.85 volts, because, at very low VDD, the logic delays increase exponentially.

Even within these limits, there is a potential problem with Rotary clocking due to the range of tunability available (note there is no problem at low VDD because Rotary clocks generally operate well below the VDD at which logic stops functioning).

Rotary clocks are hard to adjust more than around ±15% through varactors; whereas ideally, a 2:1 reduction allows VDD to be dropped significantly, thereby reducing the dynamic power.

Clock gating with PWM signal (clock skimming) (e.g., indirect rotary clocking) can get any effective low speed clock, but at the loss of the power-saving direct-drive mode since the enable signal is not energy conserving.

Therefore, here is a proposal which allows for direct drive with a choice of 2 VDDs (e.g., 1.3 volt, 0.85 volt) and two operating frequencies (e.g., 3 GHz, 1.5 GHz) with no circuit changes or varactors. Clock skimming can be also applied for clock operation down to DC.

Figure 9:
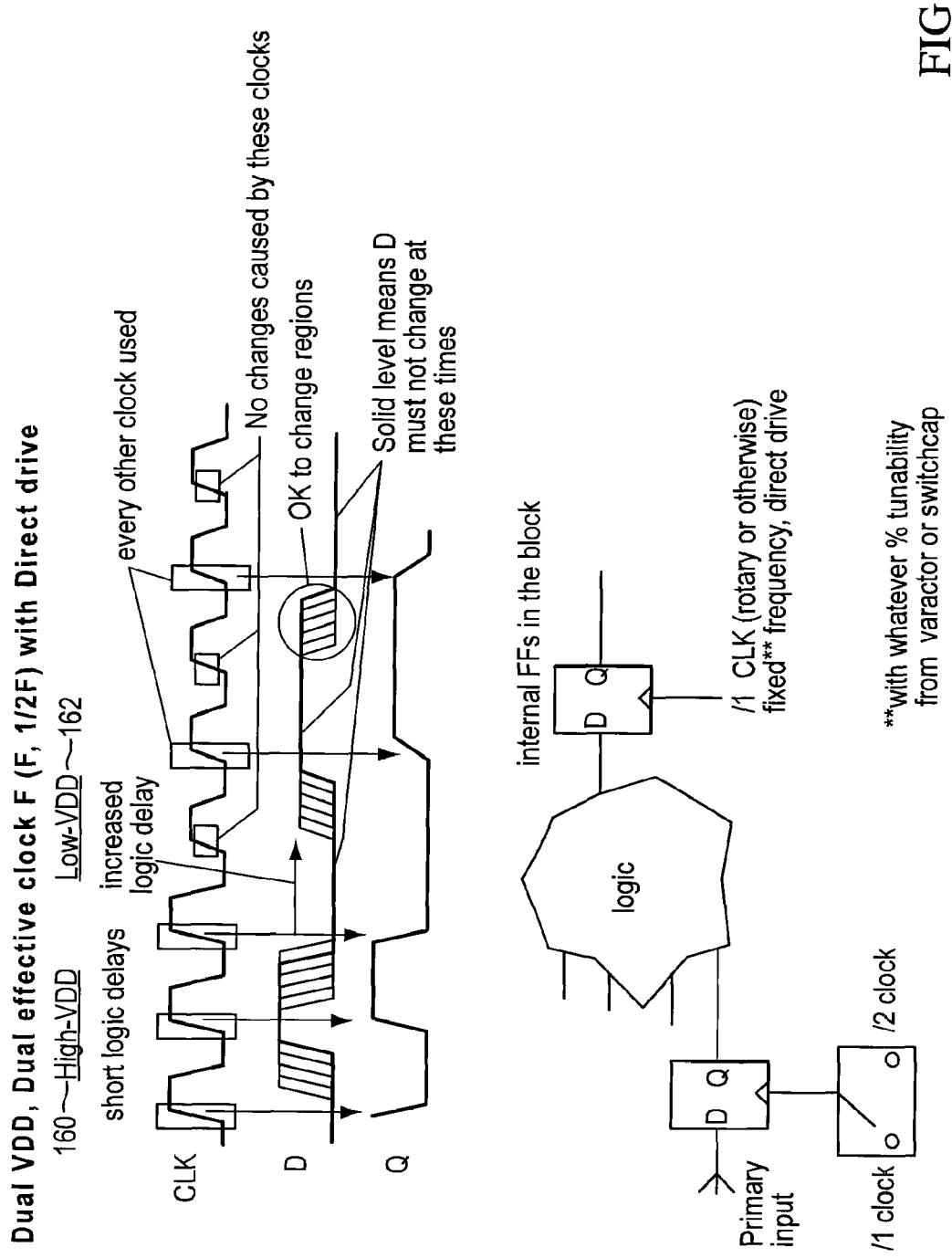
FIG. 9 diagrams the possibility of timing a circuit both in the normal VDD voltage case where Q outputs can change at every clock cycle.

FIG. 9 diagrams the possibility of timing a circuit both in the normal VDD voltage 160 case where Q outputs can change at every clock cycle, but also at a lower VDD 162 where they only change every other clock cycle (giving an effective ½ F clock frequency). This method is independent of the clock generator type but suits rotary clocks as it allows the global clock to run always at the same high speed. No special circuit techniques are needed and the effect relies on the natural effect of increasing logic delays that accompany reduced VDD. In fact, this scheme isn't hard to achieve, because at the nominal VDD and nominal clock F (especially with a scheduled skew clocking system and highly optimized timing), most FFs have D inputs with only a small amount of slack. Lowering VDD immediately stretches the logic delays to cause a setup-failure, making the outputs valid on the NEXT clock cycle. Edge triggered FFs, in this case, are preferred, because the difference between 1 F and ½ F operation is only a small time difference making the selection of the two VDD operating voltages. Somewhere at the start of the pipeline or the primary inputs and primary outputs of the hierarchical blocks, there should be a real /2 clock, which forces the "effective /2" clocking scheme to align with the correct half of the /2 period.

Two Supply Voltage Magnitudes (Selectable), Two Clk Effective Frequencies (With Same Rotary Clock Frequency).

The two-different-VDD levels feature is largely independent of the "Split supply/voltage translator" feature. The supplies could still be split and the overall VDD changed between two different magnitudes to implement the double-clocking low power mode.

Appendix DFF Vs. Latch

Generally it can be shown that a DFF is nothing more than two latches in series each operating on nominally opposite phases of the clock. Also the two phases do not have to be exactly 180 degrees out of phase (and in real DFF are slightly skewed by the internal 2 phase generators). Finally, comparing latch based designs vs. DFF designs, the DFF is seen to be a limiting case of a latch based design with logic inserted only between pairs of latches, these pairs having no logic between them. Expanding a DFF design to a latch design is a good first step to optimizing the circuit and redeploying the logic to fit between the individual latches.

Appendix Global Rotations: The Global Event Rotation (ACTIVE TIME) And The Global Management Rotation (QUIESCENT TIME) To Keep The Concept Of Single-Phase, 'Before/After'—'Day And Night'.

This relates to "System/State Registers vs. Pipeline, Hold fix registers"

Single Phase, Edge Triggered Methodology

To simplify design, analysis, testing and indeed human comprehension, traditional clocked systems generally use a single active edge which implies a before and after event with the rising edge of the clock being a 'knife edge.' This is very different from the smooth continuum of timing events such as could be generated by Rotary Clock.

This basic single-phase concept is very well established but recently has been augmented successfully by the by the concept of scheduled skew or useful skew where a small amount of skew (perhaps 10% of a cycle) spreads events around the active edge to help fix timing. These small amounts of skew can be accommodated without much change to the single-phase CAD tool infrastructure or to the testing systems like LSSD or SCAN.

There are many ways to impose this traditional concept onto a rotary clocked system. It is important to note that restricting what is allowed is done solely to aid the analysis and design tools (including human analysis) since trying to handle too many event timings can be overwhelming to both software and people.

The most obvious simplifying restriction to Rotary clocking is to use only a small fraction of the rotary loops as potential tap-points, limiting taps to points that are close to being 'same-phase' on the arrays. This is not ideal because there is a waste of power (because of padding capacitance needed) and area and does not make use of all the available phases to perform scheduled skew or hold-time fixes.

It is proposed here to simplify design, analysis and understanding of rotary clocked systems (direct drive) by arbitrarily assigning one pulse rotation of a rotary clock cycle (which is two physical rotations per complete electrical cycle) to being a Global Event Rotation and the second, subsequent pulse rotation as being a Global Management Rotation. Looking at the entire chip as being covered by phase-locked grids, the chip as a whole can be in either (a) the event rotation time (where new clock events from the visible system registers of the HDL are scheduled, i.e., new data is output form the system registers somewhere in the Global Event rotation) or (b) the whole chip is in the Management Rotation period (the next half cycle) where the only use of clocks is invisible (to the HDL and the Test engineer) for purposes outlined later.

Partitioning the two rotary rotations imposes a functional limitation (designer is not able to design for full 360 degrees of clock phase), but retains most of the advantages rotary clocking and the ease of use of the single-phase synchronous concept by restoring a sense of Global time to the chip (Although the global clock active time is be spread over a half of a cycle, as least there is the sense of the whole chip state marching along to the beat of a clock).

One analogy is the concept of "Day and Night" and the 12, 24 hour clocks. For half of the time, say 6 am to 6 pm, the chip is scheduling events, and from 6 pm to 6 am the chip is organizing itself—maybe but soon need to go back to phases. Dividing the global chip time like this gives midday as the central time. Splitting 360 degrees of phase gives 15 degrees per hour.

Global Event Rotation

Figure 10:
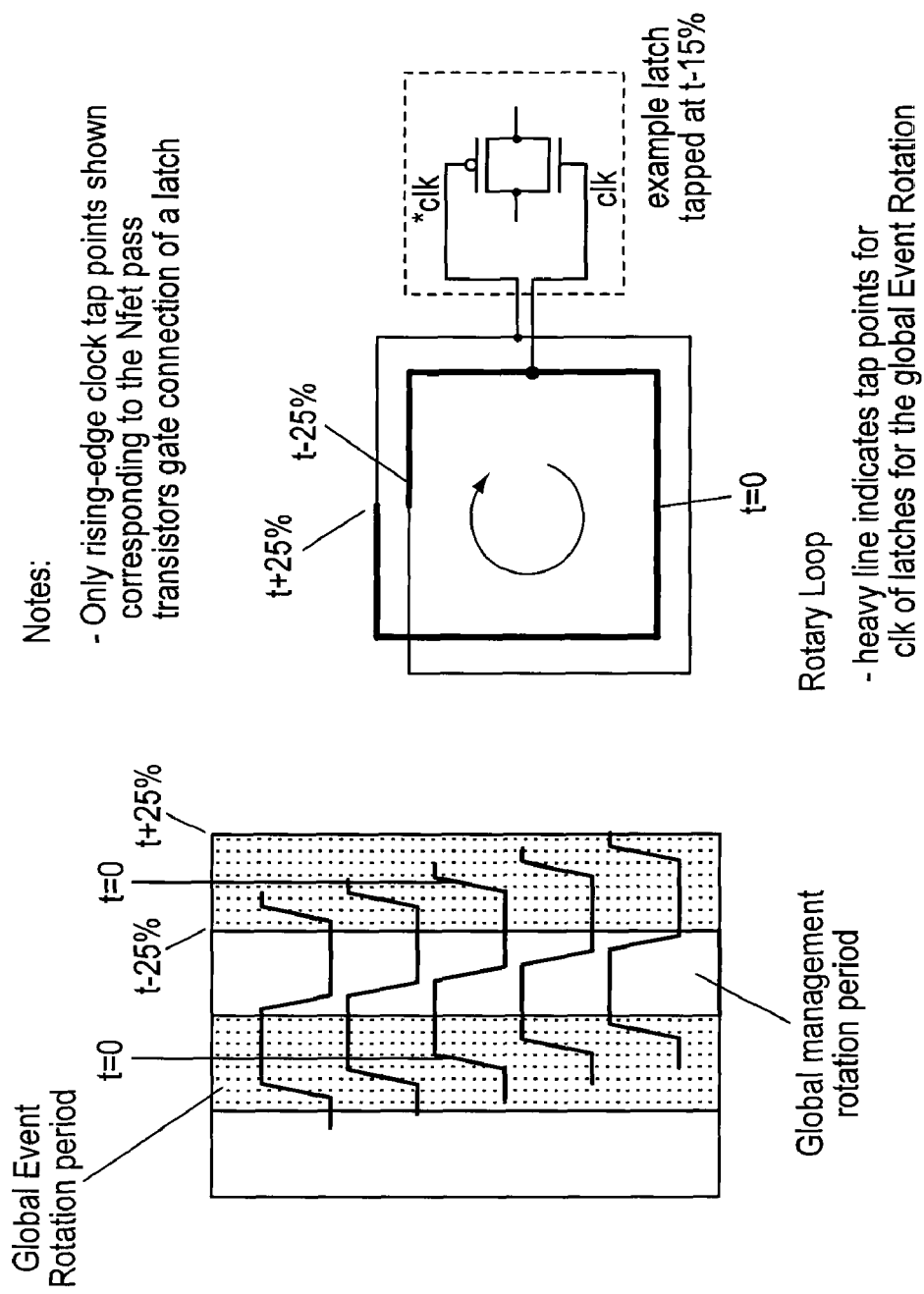
FIG. 10 shows system events defined as clock event to system registers during the event rotation, (triggered by the Rising edge of the clock phases)

System events are defined as clock event to system registers during the Event rotation, (triggered by the Rising edge of the clock phases), shown in FIG. 10. At the high-level view, we should consider the Global Event Rotation as covering ±25% of a clock cycle from the mid-point of the electrical rotation time. Scheduled skews can be picked within the Global Event Rotation period. The methodology resembles DFF edge-triggered with scheduled skew. The exact implementation typically makes use of Safety through speedlatch based design (Pseudo DFF) with hold-time fixes. System/State registers are defined as being in the design intent of the HDL designer (are implicit or explicit in the Verilog source code, i.e., The HDL designer will expect to recognize these registers in the final chip) generally scannable and steppable and have been described in previous documents.

Rotary Line Loading

For differential-clocked latches and flip-flops the whole of the rotary clock gets utilized; taps cover the whole of the rotary clock wiring and with equal-sized Nch clock transistors (one side of the transmission-line) and Pch devices using the other side of the transmission line to make the capacitance is fully balanced.

Communicating Path Concept

It is very important to realize that use can be made of multiple phases in the Global Event Rotation without implying scheduled skew or clock-clock times much different from the nominal $t_{cycle}$. Consider a path which is clocked on $t_{nom}$−25% being captured by another FF clocking at the same $t_{nom}$25% . There is still exactly one whole clock period between clock edges, even though both are not being clocked at 0 phase. Skew is only relevant to communicating paths. By gradual 'sliding' of clock phases of DFFs along a pipeline it can be seen that most communicating paths see only a tiny amount of skew and difference from the nominal cycle time. Flip-flops which are clocked from a stub load grouping see a single phase.

Spreading the clock loads around the loops by careful selection of the tap points and manipulation of the netlists is very important and a desirable goal both from a rotary clock loading perspective and from a power-surging perspective. Having all the FFs switch at the same time is not a good idea due to power supply collapse. (See FIG. 3; communicating paths on the same tap have low skew.) The point here is that scheduled skew is available if needed, but true single-phase clocking with low skew is still possible.

Quiescent (Global Management) Rotation

In this half cycle the following things are possible, (i) hidden use of larger values of scheduled skew, i.e., when phases and events timed off the Management rotation:
- to fix hold time problems through insertion of latches in fast paths;
- to balance delay times by insertion of latches selectively within the logic;
- to clock pipeline stages where these stages do not require scan, gate or single step (perhaps the test coverage requirements can be met by alternative means);
- to allow a defined time where clock gating, single-stepping and scan can be applied to the machine state.
- (Picture of the rising edges covering ½ cycle worth of time) This somewhat arbitrary restriction can be seen as clock events.

Paths from HDL or test-visible registers are always timed assuming launch in one Event rotation and capture in next Event rotation. Therefore, ½ cycle path is between a +25% tap (end of the previous event rotation) and a −25% (earliest point in the next event rotation). The other possible ½ cycle gap, i.e., launching on the −25% and capturing on +25% is not allowed because it launches and captures within the Event rotation.

Appendix A—Random Walk Optimization Algorithm for Rotary

Problem

Generate a random walk on a grid between two points with a specified maximum walk length. This is a version of the random walk problem, but with a fixed start and end points. The walk is constrained to being less or equal to a specified length, has to not double back on itself and avoid pre-set blockages.

Pre-Processing

Reading of design data—Obstructions and clock load data are found from DEF file or database.

Clustering—Clustering can be performed on the clock loads as a preliminary step to reduce the amount of work required by reducing the effective number of load-points to reach. Clustering was described in a previous patent application, GB0212869.2, and groups together clock loads which are interwired by, say a differential router.

Solution:

1) Calculate the theoretical minimum number and type (left, right, up, or down) of moves to get you from start to end. This is not taking into account blockages so is a simple calculation. Store these numbers.

2) Deduct the above number of moves from the total allowed number of moves (the maximum walk length) and store the number. This is the number of random moves allowed in any direction. Round this number down to the nearest even.

3) Select randomly one of the five choices (left, right, up, down, or random) via a random number generator, with linear weighing for the number of moves left for each type.

Also a mask can be specified which blocks out moves in the given directions (I call this the direction mask). If the direction mask blocks all directions, i.e., when there is no valid move, then the path is undone by one step, with the previous direction mask restored and updated to mask the last unsuccessful step. If the number of undoes for a path reaches a set tolerance then the entire walk is restarted, the walk has reached some sort of dead end. If the number of restarts reaches a given limit then the walk is aborted, no path could be found. That is, if you have left=10 right=1 up=2 down=3 random=4 there is ½ chance of left, ⅕ chance of random, etc. If left was masked then there is ⅖ chance of a random move.

4) If a "random" move was generated then reroll the move from the unmasked directions, but each direction now having equal probability.

5) Check the potential move against previous moves so that it does not double back on itself. Also check against any blockages. If either of these two checks fail the move is invalid. The direction mask is updated to mask the invalid move and the program goes back to step 3.

6) The move is accepted. If the move was generated by a "random" move then the number of "random" moves left is decreased by two, and one is added to the number of moves left in the opposite direction.

Otherwise, decrease the number of moves left in the taken direction by one.

7) Store the direction taken and the last direction mask used. Set the direction mask to only mask the direction you came from. Check that you have not arrived at your destination, if so terminate, else go to step 3.

It should be noted that:
i) the blockages and points which the walk has already visited are stored in hash tables to speed up access. The hash function used to turn the x and y coordinates to a hash value is $(x\hat{\ }(y<<16|y>>16))$. This function is used as rarely x, $y>2\hat{\ }16$, so maximum entropy for the hash value is achieved at minimal computational cost. This greatly reduces the cost of searching to check if a move is invalid;
ii) The direction mask is implemented as a bit mask, bit 0 masking UP, 1 LEFT, 2 RIGHT, 3 DOWN. Thus the direction mask is a number from 0 to 15. A table lookup was made which returns the available directions for a given mask. This saves critical CPU time in the inner loop of generating the moves;
iii) The way the moves are semi-randomized makes the walk always reach the destination as long as it is not blocked by itself or and blockages. Each "random" move taken is balanced by adding a move quota in the opposite direction. See step 6 above;
iv) Using a direction mask and saving it and reusing it in the case of an undo in step 3 minimizes the amount of wasted checks and moves, and allows a systematic search of the available solution space.

Conclusion:

The above algorithm can quickly generate a number of trail paths within the given constraints. This routine can then be incorporated into a search routine to find an optimal path given some cost function, like minimum path length.

Problem

On a given area you have a number of points (clock loads) scattered around. Also there are a number of blockages. The task is to find a closed path with a fixed length and a number of fixed anchors which minimizes the average distance between the path and each of the points while avoiding the blockages.

Solution

In effect you have a number of paths between the anchors, each of a fixed length.
1) For each path the above random walk routine is called set the initial route of the closed path;
2) A cost function is then called to find the total distances between the points and their nearest points on the path.
3) The simulation temperature is set to 1;
4) A random section of the path is chosen that is (temperate)*(total path length) long;
5) A new random walk is created between the start and end points of the section such that the total length of the whole path does not breach the constraints;
6) If the new combined path has a lower cost or shorter distance at the same cost then it is accepted, otherwise it is rejected.
7) Go to Step 4 for a given number of iterations;
8) Lower the temperature, and go to step 4 until the temperature equals zero;
9) Terminate, path found.

It should be noted that:
i) The cost function is not fully calculated for each iteration, only the difference is. Not all points would have moved to a different nearest point on the path.
ii) The profile of the temperature drop and the number of iterations strongly effect the efficiency of the routine as per standard simulated annealing.
iii) The annealing method allow the routine to search a number of radically different paths, and allows time to fine tune the selected path.

Problem

To implement the Rotary Clock on a chip you need to clock connect each clock load to the Rotary Clock. The interconnect distance must be minimized to reduce ringing on the clock wave form. Also each closed loop length in the Rotary Clock must be an integer multiple of the smallest closed loop so the Rotary Clock can phase lock.

Solution

Split the chip into equal rectangular regions. In each region place four random walk paths from the centre of each side to each adjacent side, each with a fixed length. Using the above routine optimize the random walks to minimize the interconnect. The fixed lengths of the random walks enforce the condition on the ring loop lengths.

Conclusion of Appendix

The routine is one method of implementing the Rotary Clock which uses the best features and provides an automated way of choosing a optimal layout. It also works well within the given constraints of the Rotary Clock.

Although the present invention has been described in considerable detail with reference to certain preferred versions thereof, other versions are possible. Therefore, the spirit and scope of the appended claims should not be limited to the description of the preferred versions contained herein.

What is claimed is:

1. A method for generating a design for logic circuitry, the method comprising:
arranging a plurality of rotary traveling wave oscillators (RTWO) into a number of rows and a number of columns to form a rotary oscillator array, each RTWO having a signal path providing a clock with multiple phases;
interconnecting adjacent array elements so that the RWTO in each array element is phase synchronous with the RTWO in an adjacent element;
placing a number of clocked devices along the signal path of each array element, each clocked device having a clock input, a data input and a data output;
connecting each clock input of the plurality of clocked devices in each element to one of the multiple phases provided by the RTWO element;
partitioning the logic circuitry into a number of partitions and mapping each partition to one or more RTWO array elements such that the number of interconnects between partitions, according to a netlist, is minimized and such that partition boundaries are at the data outputs of clocked devices;
placing the logic circuitry partitions into regions corresponding to areas bounded by the one or more RTWO elements of the array to which the partition is mapped; and
connecting the circuitry in the partition between the clocked devices in the element of the array according to the net list by determining the worst-case logic delays of the partitioned circuitry, and selecting the clocked devices between which the partitioned circuitry is connected based on the worst-case logic delays.

2. A method for generating a design, as recited in claim 1, wherein each partition is mapped to unique one of the array elements.

3. A method for generating a design, as recited in claim 1, wherein circuitry in one of the partitions has a fast data path that causes a hold time violation; and
further comprising the step of inserting a level sensitive latch in the fast data path to prevent the hold time violation.

4. A method for generating a design, as recited in claim 1, wherein clock tap stubs are made available in a direction approximately orthogonal to the signal path of at least one of the RTWO elements; and
wherein the step of connecting each clock input of the plurality of clocked devices in said element to one of the multiple phases provided by said RTWO element includes connecting the clock inputs of the clocked devices to clock tap stubs.

5. A method for generating a design, as recited in claim 1, wherein mapping each partition to one or more array elements includes:
combining adjacent array elements into pairs; and
mapping a partition to a pair of array elements.

6. A method for generating a design, as recited in claim 1, wherein the partitioning step includes:
assigning a high edge weighting to a partition boundary that cuts across a combinational logic path; and
assigning a low edge weighting to a partition boundary that cuts across a clocked device output so that a partition boundary at the output of a clocked device is encouraged and a partition boundary across combinational logic is discouraged.

* * * * *